US006117601A

United States Patent [19]

Kanazawa et al.

[11] Patent Number: 6,117,601

[45] Date of Patent: Sep. 12, 2000

[54] METHOD OF DETERMINING AND CORRECTING PROCESSING STATE OF PHOTOSENSITIVE MATERIAL BASED ON MAHALANOBIS CALCULATION

[75] Inventors: Yukihiko Kanazawa; Shinzo Kishimoto; Jun Okamoto; Yoshio Ishii; Yoshihiro Fujita, all of Kanagawa, Japan

[73] Assignee: Fuji Photo Film Co., Ltd., Kanagawa, Japan

[21] Appl. No.: 09/328,592

[22] Filed: Jun. 10, 1999

[30] Foreign Application Priority Data

| | | | |
|---|---|---|---|
| Dec. 9, 1998 | [JP] | Japan | 10-350447 |
| Dec. 28, 1998 | [JP] | Japan | 10-373197 |

[51] Int. Cl.[7] .......... G03F 9/00

[52] U.S. Cl. .......... 430/30; 430/331

[58] Field of Search .......... 430/30, 331

*Primary Examiner*—Christopher G. Young

*Attorney, Agent, or Firm*—Sughrue, Mion, Zinn, Macpeak & Seas, PLLC

[57] ABSTRACT

The state of a photosensitive material processing solution is easily determined from values of multi-dimensional analysis by utilizing Mahalanobis distance. The Mahalanobis distance is calculated, and a determination is made as to whether or not the Mahalanobis distance is greater than or equal to a threshold value. If the Mahalanobis distance is less than the threshold value, the processing solution is determined to be normal, the Mahalanobis distance is displayed on a display unit, and a determination is made as to whether or not the number of sets m of normal values has become greater than or equal to a predetermined value $m_0$. If $m \geqq m_0$, data of the characteristic values in the oldest set in a time series is deleted, and a set of data of newly detected characteristic values is added to calculate the Mahalanobis distance and update a database. If the Mahalanobis distance is greater than or equal to the predetermined value, a developing solution is determined to have become abnormal, the degree of abnormality is displayed, factors which caused the abnormality are determined, a corrective measure is determined on the basis of a combination pattern of factors, and the measure is displayed.

23 Claims, 14 Drawing Sheets

DEVELOPING SOLUTION FOR PLATE-MAKING PHOTOSENSITIVE MATERIAL (ANALYSIS-1)

DEVELOPING SOLUTION FOR PLATE-MAKING PHOTOSENSITIVE MATERIAL (ANALYSIS-2)

FIXING SOLUTION FOR PLATE-MAKING PHOTOSENSITIVE MATERIAL (ANALYSIS-1)

BLEACH-FIXING SOLUTION FOR COLOR PAPER

METHOD OF DETERMINING AND CORRECTING PROCESSING STATE OF PHOTOSENSITIVE MATERIAL BASED ON MAHALANOBIS CALCULATION

BACKGROUND OF THE INVENTION

1. Field of the Invention

The present invention relates to a method of determining the processing state of a photosensitive material and a method of correcting the processing state of a photosensitive material, and more particularly to a method of determining the processing state of a photosensitive material for determining the states of a processing solution and processing conditions of a photosensitive material such as a silver halide photosensitive material, as well as a method of correcting the processing state of a photosensitive material for correcting the processing solution and the processing conditions on the basis of the result of determination made in the determining method.

2. Description of the Related Art

The processing of silver halide photosensitive materials normally involves development processing in which the exposed particles that form the latent image are selectively reduced (developed) using a developing solution, fixation processing in which the unexposed particles are removed by dissolving with a fixing solution, and washing and drying processing that follow fixation processing. If the developing solution is taken as an example, the components of the developing solution are diverse, and include a primary developing agent, a preservative, a development inhibitor, and the like. Since these vary in a complex manner while mutually interacting depending on the processing conditions, items of analysis, i.e., characteristic values, for ascertaining the states of the processing solution and processing conditions of the silver halide photosensitive material are diverse.

Hitherto, to determine whether the state of a commercially available processing solution causes no problem in the photographic quality, a determination has been experientially made principally from the values of analysis of the solution components in light of their difference with the composition of a fresh photosensitive material processing solution. At that juncture, although the determination should be made not only from the mutual relationship between the components of the solutions but also by including the correlation with the type of the processing machine and the processing conditions, the determinations in many cases are made qualitatively on the basis of the values of analysis, and it has been difficult to derive a result of determination from the values of multi-dimensional analysis as in the case of the diagnosis of processing solutions.

SUMMARY OF THE INVENTION

The present invention has been devised to overcome the above-described problem, and its object is to provide a method of determining the processing state of a photosensitive material which makes it possible to easily determine the state of at least one of the processing solution and the processing conditions of a photosensitive material from the values of multi-dimensional analysis by using the Mahalanobis distance, as well as a method of correcting the processing state of a photosensitive material for correcting the state of at least one of the processing solution and the processing conditions on the basis of the result of the determination made in this determining method.

To attain the above object, in accordance with a first aspect of the present invention, there is provided a method of determining the processing state of a photosensitive material, comprising the steps of: preparing a Mahalanobis space on the basis of characteristic values of a processing solution for a photosensitive material in a normal state which does not cause problem s in photographic quality or respective characteristic values of the processing solution and a processing condition for the photosensitive material in the normal state; calculating a Mahalanobis distance on the basis of the Mahalanobis space; and determining the state of at least one of the processing solution and the processing condition on the basis of the calculated Mahalanobis distance.

In accordance with a second aspect of the present invention, there is provided a method of determining the processing state of a photosensitive material, comprising the steps of: detecting n (where n≧ak if a is assumed to be a positive integer greater than or equal to 1) sets of k (where k is an integer≧2) kinds of characteristic values with respect to a processing solution for processing a photosensitive material, or the processing solution and a processing condition for processing the photosensitive material; calculating a Mahalanobis distance ($MD^2$) which is expressed by a formula below with respect to a combination of the k kinds of characteristic values $Y_{i,j}$ (where, i is the number of characteristic values, and i=1, 2, 3, . . . , k; and j is the number of sets of characteristic values, and j=1, 2, 3, . . . , n) detected at the time of conducting the determination of the state; and determining the state of at least one of the processing solution and the processing condition on the basis of the magnitude of the calculated Mahalanobis distance $$MD^2 = \frac{1}{k}\sum_{p,q=1}^{k} a_{pq}\cdot y_p\cdot y_q \tag{a}$$

where $a_{pq}$ is a component of an inverse matrix $R^{-1}$ of a correlation matrix R having as its components correlation coefficients $r_{p,q}$ (where, p, q=1, 2, 3, . . . , k) between a p-th standardized characteristic value $y_p$ and a q-th standardized characteristic value $y_q$ among k standardized characteristic values $y_i$ of a set of number j, and is a value indicating a Mahalanobis space prepared in advance on the basis of the k kinds of n sets of the characteristic values of the processing solution and the processing condition in a normal state, a standardized characteristic value $y_{i,j}$ of the set of number j being expressed by a following formula by using an average value $m_i$ of the characteristic value of number i and a standard deviation σi of the characteristic value of number i:

$$y_{i,j}=(Y_{i,j}-m_i)/\sigma_i$$

where $$m_i=(Y_{i,1}+Y_{i,2}+ . . . +Y_{i,n})/n \quad \sigma_i^2=[(Y_{i,1}-m_i)^2+(Y_{i,2}-m_i)^2+ . . . (Y_{i,n}-m_i)^2]/(n-1).$$

It should be noted that the correlation matrix R and the inverse matrix $R^{-1}$ of the correlation matrix R are expressed as shown below, and the Mahalanobis distance expressed by formula (a) above can be calculated by using the correlation matrix R, the inverse matrix $R^{-1}$ of the correlation matrix R, or components of these matrices.

$$R = \begin{vmatrix} 1 & r_{12} & r_{13} & \cdots & r_{1k} \\ r_{21} & 1 & r_{23} & \cdots & r_{2k} \\ r_{31} & r_{32} & 1 & \cdots & r_{3k} \\ & \vdots & & & \\ \vdots & r_{pq} & \vdots & & \vdots \\ & \vdots & & & \\ r_{kl} & r_{k2} & r_{k3} & \cdots & 1 \end{vmatrix} \quad (3)$$

$$A = R^{-1} = \begin{vmatrix} a_{11} & a_{12} & a_{13} & \cdots & a_{1k} \\ a_{21} & a_{22} & a_{23} & \cdots & a_{2k} \\ a_{31} & a_{32} & a_{33} & \cdots & a_{3k} \\ \vdots & \vdots & \vdots & & \vdots \\ a_{kl} & a_{k2} & a_{k3} & \cdots & a_{kk} \end{vmatrix}$$

In the second aspect of the invention, a correlation matrix, an inverse matrix of the correlation matrix, or components of these matrices, which are calculated on the basis of the k kinds of n sets of the processing solution and the processing condition in the normal state is used as the Mahalanobis space in the first aspect of the invention. The Mahalanobis distance which is expressed by formula (a) above is calculated by using the correlation matrix, the inverse matrix of the correlation matrix, or components of these matrices, and the state of at least one of the processing solution and the processing condition is determined from the magnitude of the Mahalanobis distance calculated.

Here, in each of the above-described aspects of the invention, the normal state refers to states of the processing solution and the processing condition which do not cause problems in the photographic properties.

The Mahalanobis distance is one technique in multi-dimensional analysis, and is said to be effective in evaluation in a case where a multiplicity of variables (items or characteristic values) interact with each other in a complex manner. According to the study conducted by the present inventors, it was confirmed that the Mahalanobis distance is effective in the determination of the state of at least one of the processing solution and the processing condition for processing black-and-white or color photosensitive material such as processing solutions for silver halide photosensitive material.

In accordance with the above-described aspects of the invention, since the Mahalanobis distance is used, it is possible to easily determine the state of at least one of the processing solution and the processing condition for the photosensitive material from the values of multi-dimensional analysis. Accordingly, it is possible to quantify the degree of deterioration of the state of at least one of the processing solution and the processing condition, and by extracting factors which deteriorated the state of at least one of the processing solution and the processing condition, it is possible to adopt speedy measures by narrowing down to optimum countermeasures.

It should be noted that in the second aspect of the invention, it is preferable to make variable the value of at least one of k and n so that an arbitrary value can be set.

In addition, n in the second aspect of the invention can be set to the number of users subject to determination of the processing state, whereby it is possible to determine the state of at least one of the processing solution and the processing condition for each user. In addition, n can be set to a sampling frequency when sampling is effected in a time series, whereby it is possible to determine the state of at least one of the processing solution and the processing condition for at least one user. At the same time, the degree of deterioration of the state of at least one of the processing solution and the processing condition can be estimated from time-series data, thereby maintaining the processing solution and the processing condition in the normal state and stabilizing the finished quality of photographs.

In addition, by calculating the Mahalanobis distance by adding newly detected m (where m is an integer$\geqq$1) sets of characteristic values to the n sets of characteristic values detected in advance, the Mahalanobis space expressed by the correlation matrix R, the inverse matrix $R^{-1}$ of the correlation matrix, or components of these matrices, it is possible to set an appropriate Mahalanobis space for the processing solution in the normal state whose composition and physical properties have changed from the state of fresh solution due to fatigue, so that the determination of the state of the processing solution can be made accurately.

When the Mahalanobis space is updated, if the number of the sets of characteristic values has reached (n+m) sets by adding newly detected sets of characteristic values, at least one set of characteristic values, e.g., the oldest characteristic values in a time series, is deleted to calculate the Mahalanobis distance. Then, it is possible to reduce the storage capacity of a storage means for storing the characteristic values. Incidentally, the set of characteristic values which is deleted may be an arbitrary set.

In a third aspect of the present invention, in each of the above-described aspects of the invention, the characteristic values in the normal state for preparing the Mahalanobis space include a characteristic value of the processing solution in its initial state.

Although processing solutions all have the same composition and physical properties at the time of preparation (fresh solution), commercial processing solutions in small-scale laboratories and large-scale laboratories are somewhat deteriorated by the processing of photosensitive materials, and the probability of the presence of the processing solutions in fresh-solution states is low. For this reason, if the Mahalanobis distance of a fresh solution is calculated on the basis of the characteristic values of the processing solution for which the probability of the presence of the processing solution in its fresh solution state has been lowered, there is a possibility that the Mahalanobis distance of a fresh solution becomes extremely large despite the fact that the solution is in a normal state.

Accordingly, in the third aspect of the invention, the Mahalanobis space is prepared by using the characteristic values of the processing solution for a photosensitive material in its normal state which causes no problems in practical use and the fresh-solution characteristic values of the processing solution for a photosensitive material, i.e, the characteristic values in an initial state of the processing solution.

In the third aspect of the invention, since the Mahalanobis space is prepared by adding the fresh-solution characteristic values of the processing solution for a photosensitive material to the characteristic values of the processing solution for a photosensitive material in its normal state which causes no problems in practical use, the Mahalanobis distance of a fresh solution becomes approximately 1, and the Mahalanobis distance comes to change in correspondence with the degree of fatigue by using as the standard a new normal state which also includes the fresh-solution state. For this reason, it is possible to determine the states of all processing solutions including fresh solutions.

If the processing solution for the photosensitive material is a developing solution for a plate-making photosensitive material, at least the pH of the developing solution, the specific gravity of the developing solution, the amount of primary developing agent in the developing solution, the amount of sulfate in the developing solution, and the amount of plate-making photosensitive material processed are preferably used as the characteristic values.

If the processing solution for the photosensitive material is a fixing solution for a plate-making photosensitive material, at least the pH of the fixing solution, the amount of thiosulfate in the fixing solution, and the amount of sulfate in the fixing solution a re preferably used as the characteristic values.

If the processing solution for the photosensitive material is a developing solution for a color photosensitive material including a color negative film, a color reversal film, and a color paper, at least the pH of the developing solution, the specific gravity of the developing solution, the amount of primary developing agent in the developing solution, the amount of sulfate in the developing solution, and the amount of halogen in the developing solution are preferably used as the characteristic values.

If the processing solution for the photosensitive material is a fixing solution for a color photosensitive material, at least the pH of the fixing solution, the amount of sulfate in the fixing solution, and the amount of silver in the fixing solution are preferably used as the characteristic values.

If the processing solution for the photosensitive material is a bleaching solution for a color film, including a color negative film and a color reversal film, at least the pH of the bleaching solution, the amount of halogen in the bleaching solution, and the amount of amino polycarboxylic acid-iron complex (e.g., 1.3PDTA-Fe, i.e., 1,2-propylenediamine tetra-acetic acid-iron complex, or the like) in the bleaching solution are preferably used as the characteristic values.

As the aforementioned halogen, it is possible to cite Br, Cl, I, and preferably Br.

If the processing solution for the photosensitive material is a bleach-fixing solution for a color paper, at least the pH of the bleach-fixing solution, the amount of sulfate in the bleach-fixing solution, and the amount of amino polycarboxylic acid-iron complex (e.g., ethylene diamine tetra-acetic acid-iron complex) in the bleach-fixing solution are preferably used as the characteristic values.

In the above-described method of determining the processing state of a photosensitive material, the state of at least one of the processing solution and the processing condition can be determined on the basis of a result of comparisons, carried out for each of characteristic values, between the Mahalanobis distance in a case in which a characteristic value is present and the Mahalanobis distance in a case in which said characteristic value is not present. Specifically, it is effective to determine the state of at least one of the processing solution and the processing condition through visual observation by using a factorial effect diagram in which the Mahalanobis distance in a case where a characteristic value is present and the Mahalanobis distance in a case where this characteristic value is not present are plotted for each characteristic value.

If the factorial effect diagram is prepared for each user, it is possible to narrow down the countermeasures suitable for the users.

In addition, in a fourth aspect of the present invention, at least one of the processing solution and the processing condition is corrected on the basis of a result of a determination made by the above-described method of determining the processing state of a photosensitive material. In accordance with the present invention, since correction is effected on the basis of the factors which deteriorated the state which was accurately determined as described above, accurate correction can be performed.

As described above, in accordance with the first and second aspects of the present invention, since the Mahalanobis distance is used, the state of the processing solution and the processing condition for the photosensitive material can be quantified from the values of multi-dimensional analysis. Hence, it is possible to obtain the advantage that the level of deterioration of the state can be determined accurately.

In addition, in accordance with the third aspect of the present invention, since the Mahalanobis space is prepared by using analyzed-value data on the characteristic values of silver halide photosensitive material processing solution in its normal state which causes no problems in practical use and analyzed-value data on the fresh-solution characteristic values of silver halide photosensitive material processing solution, it is possible to obtain an advantage in that the states of all the processing solutions including fresh solution can be determined.

In accordance with the fourth aspect of the present invention, since correction is effected on the basis of the factors which deteriorated the state which was accurately determined, an advantage can be obtained in that accurate correction can be performed speedily.

DETAILED DESCRIPTION OF THE INVENTION

Figure 1:
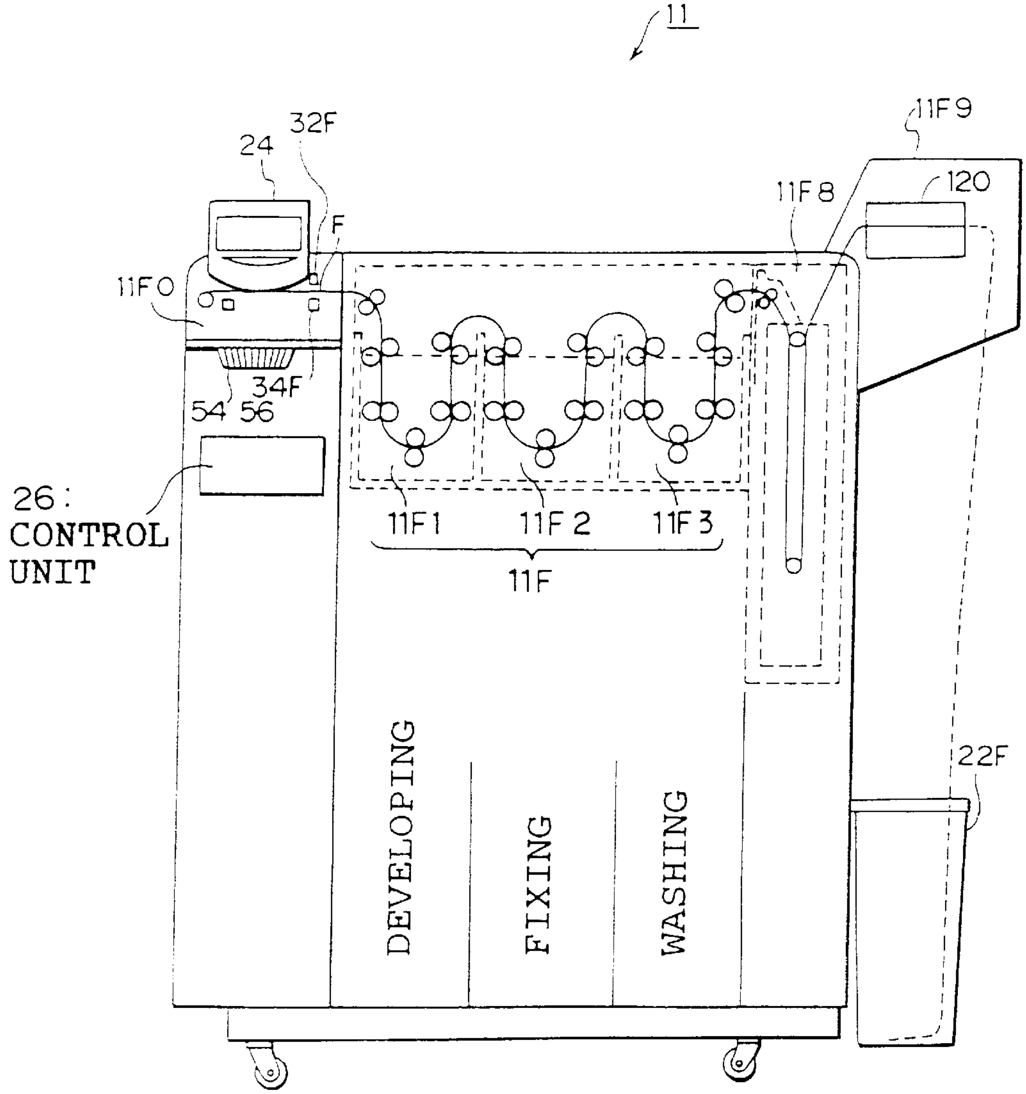
FIG. 1 is a schematic diagram of a film processor in accordance with a first embodiment of the present invention.

Hereafter, a detailed description will be given of the embodiments of the present invention.

First, a description will be given of the results of examination in which, regarding developing solutions for plate-making photosensitive materials, of the processing solutions used in commercial developing laboratories, those processing solutions that did not cause problems in photographic characteristics and the like were considered to be normal, and as data for creating a Mahalanobis space, analysis solution value data from commercial developing laboratories (about 100) were adopted as characteristic values. The normal processing solutions include fresh solution.

As the characteristic values, the following were used: the type of plate-making photosensitive material, the type of processor, the amount of processing per month, a day's operating hours, a week's operating hours, the dilution ratio of the replenishing solution, the amount of replenishment with replenishing solution, the pH of the developing solution, the specific gravity of the developing solution, the amount of primary developing agent in the developing solution, the amount of sulfite in the developing solution, the amount of halogen in the developing solution, and so on.

Since the most numerous among the abnormalities of the developing solution was the trouble of a decline in the maximum density, the relationship between the Mahalanobis distance and the assessment based on conventional evaluation methods is shown in Table 1, and the result of investigation of the correspondence between the Mahalanobis distance and actual photographic properties maximum density is shown in Table 2.

TABLE 1

| User name | Mahalanobis distance | Assessment using conventional evaluation methods |
|---|---|---|
| A | 1.1 | Totally normal solution |
| B | 2.2 | Normal solution |
| C | 2.8 | Slightly abnormal solution |
| D | 3.5 | Slightly abnormal solution (slightly concentrated) |
| E | 3.5 | Slightly abnormal solution (slight tendency toward oxidation in air) |
| F | 4.5 | Abnormal solution (concentrated) |
| G | 7.0 | Abnormal solution (concentrated) |

TABLE 2

| Solution state | Mahalanobis distance | Photographic properties (maximum density) |
|---|---|---|
| Fresh solution | 1.0 | 5.25 |
| Sample 1 | 1.8 | 5.3 |
| Sample 2 | 2.2 | 4.8 |
| Sample 3 | 2.2 | 4.7 |
| Sample 4 | 3.3 | 4.6 |
| Final solution | 4.6 | 4.35 |

It was confirmed that there is an approximate correlation between the Mahalanobis distance (about 2.5) in the section where the steep density gradient is noted (maximum density of 5 or thereabouts) in Table 2 above and the Mahalanobis distance (about 2.5) at which actual complaints begin to occur in Table 1, and it was confirmed that 2.5 is optimum as the threshold value of the Mahalanobis distance.

In addition, the results of examination of the developing solution, fixing solution, and bleaching solution for a film processor, the bleach-fixing solution for color paper processing, and the fixing solution for plate-making photosensitive material were also substantially similar to those described above, and it was found that the states of photosensitive material processing solutions such as the developing solution, fixing solution, and bleaching solution can be determined by setting the threshold value of the Mahalanobis distance to 2 to 3.

Next, a description will be given of embodiments in which the present invention is applied to a specific processor on the basis of the above-described findings.

In a first embodiment, the present invention is applied to a case in which the states of various processing solutions including the developing solution, fixing solution, and washing water which are used in a film processor for developing and processing a plate-making photosensitive material are determined, and the processing solutions are corrected in correspondence with the states of the processing solutions.

As shown in FIG. 1, a film processor 11 has a loading section 11F0 for loading a plate-making photosensitive material F. The plate-making photosensitive material F with images exposed thereon is loaded in this loading section 11F0, and the loaded photosensitive material F is transported into a processor section 11F.

Processing tanks including a development processing tank 11F1, a fixation processing tank 11F2, and a washing tank 11F3 are sequentially disposed in the processor section 11F, and a development processing solution, a fixing solution, and washing water are sequentially stored in the processing tanks, respectively. In addition, the respective processing tanks are provided with rollers, which form a transporting path between the processing tanks and through the processing tanks. The photosensitive material F is transported by the rollers so as to pass through the respective processing tanks, and when it passes through each processing tank, the photosensitive material F is immersed in each processing solution and is thereby subjected to processing.

In addition, a drying section 11F8 is disposed adjacent to the processor section 11F. The drying section 11F8 dries the photosensitive material F by reciprocally transporting the photosensitive material F in the vertical direction. Then, the photosensitive material F is accommodated in an accommodating box 22F.

The loading section 11F0 is provided with an environment thermometer 54 for detecting the environmental temperature, an environment hygrometer 56 for detecting the environmental humidity, and a photosensitive-material detecting sensor which is comprised of an infrared radiating unit 32F and an infrared detecting unit 34F. The infrared radiating unit 32F is formed by arranging a plurality of infrared radiating elements in a direction perpendicular to the transporting direction of the photosensitive material F (in the widthwise direction of the photosensitive material F), while the infrared detecting unit 34F is formed such that a plurality of detecting elements for detecting the infrared rays radiated from the infrared radiating elements are arranged in the direction perpendicular to the transporting direction X of the photosensitive material F. In addition, a gap allowing the photosensitive material F to pass therethrough is provided between the infrared radiating unit 32F and the infrared detecting unit 34F. When the photosensitive material passes therethrough, the infrared rays a re shut off by the photosensitive material, so that by counting the shutoff time by a control unit 26 which will be described later, it is possible to detect the amount of photosensitive material processed, i.e. the amount of photosensitive material processed per unit time (e.g., one day).

A display panel 24 formed by a liquid-crystal display unit is provided on top of the loading section 11F0, and an infrared sensor unit 120 for detecting the amount of Ag remaining on the photosensitive material F is provided in a passing portion 11F9 through which the photosensitive material passes after drying.

The infrared sensor unit 120 is formed by an infrared radiating diode and a photodiode disposed in face-to-face relation to the infrared radiating diode, and outputs a signal responsive to the amount of Ag remaining on the photosensitive material on the basis of an output of the photodiode by making use of the fact that the amount of transmission of infrared rays transmitted through the photosensitive material F varies depending on the amount of remaining Ag. The control unit 26, which will be described later, detects the residual amount of Ag on the photosensitive material on the basis of the output from the infrared sensor unit 120, and detects the amount of Ag dissolved in the fixing solution by subtracting the residual amount of Ag from a known amount of Ag coated on the photosensitive material.

Since the aforementioned processing tanks 11F1 to 11F3 have substantially identical configurations, a description will be given of the development processing tank 11F1, and a description of the other processing tanks 11F2 and 11F3 will be omitted.

Figure 2:
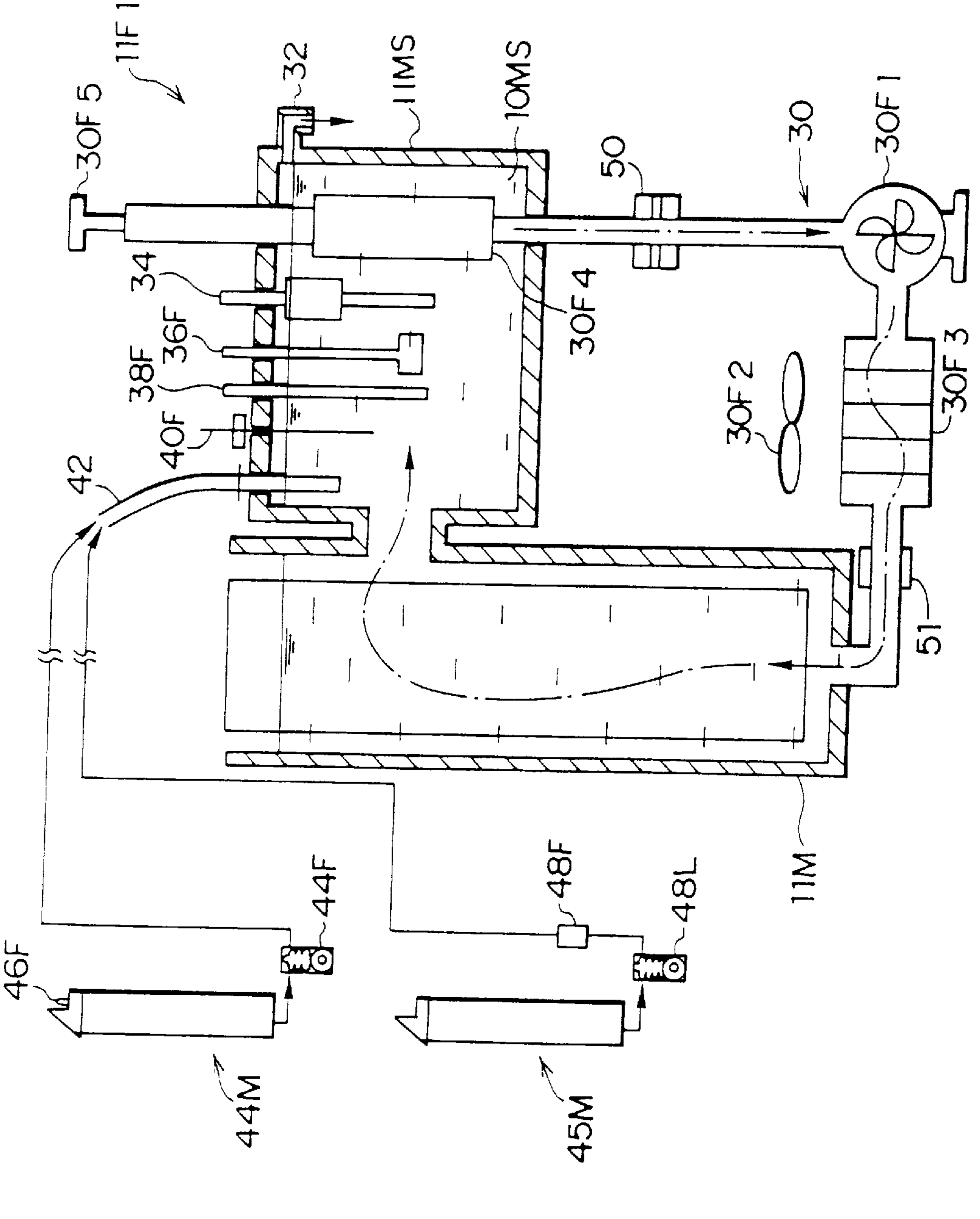
FIG. 2 is a cross-sectional view illustrating a developing and replenishing device in accordance with the first embodiment.

As shown in FIG. 2, the development processing tank 11F1 ha s a processing tank 11M in which the developing solution is stored, a subtank 11MS communicating with the processing tank 11M, a replenishing tank 44M in which a replenishing solution for replenishing the subtank 11MS is stored, and a water replenishing tank 45M in which water for replenishing the subtank 11MS is stored.

The subtank 11MS is connected to the replenishing tank 44M so as to allow the replenishing solution to be replenished through a replenishing nozzle 42 and a replenishing pump 44F, and is connected to the water replenishing tank 45M so as to allow water to be replenished through the replenishing nozzle 42 and a replenishing pump 48L.

The replenishing tank 44M is provided with an ultrasonic level meter 46F for detecting the level of the replenishing solution in the replenishing tank 44M. A water supply pipe connected to the water replenishing tank 45M is provided with a water flow meter 48F for detecting the volume of water supplied through the replenishing pump 48L.

Further, the subtank 11MS is provided with a temperature sensor 40F for detecting the temperature of the developing solution in the subtank 11MS, a pH sensor 38F for detecting the pH of the developing solution, a hydrometer 36F for detecting the specific gravity of the developing solution, and a level detector 34 for detecting the level of the developing solution. Incidentally, reference numeral 32 denotes a discharge port for allowing unnecessary developing solution to overflow as a waste solution. This waste solution is stored in an unillustrated waste solution tank.

The development processing tank 11F1 is further provided with a circulating device 30 which allows the developing solution stored in the processing tank 11M and the subtank 11MS to circulate from the processing tank 11M toward the subtank 11MS, as shown by the broken line. This circulating device 30 is comprised of a circulating pump 30F1, a cooling fan 30F2, a heater 30F3, a circulation flow meter 51, a filter mounting rod 30F5, and a circulation filter 30F4. The temperature of the developing solution is regulated under feedback control by this circulating device 30 so as to become the set temperature (the temperature for appropriately processing the photosensitive material F (e.g., 35 [°C.]).)

An electric conductivity meter 50 of a coil type is provided on a pipe extending from the circulation filter 30F4 to an inlet of the circulation pump 30F1. It should be noted that, as the electric conductivity meter, it is possible to use an electric conductivity meter in which a voltage is applied across a plurality of electrodes to measure electric conductivity.

The hydrometer 36F determines time required for an ultrasonic wave to be propagated a predetermined distance $D_2$ in the developing solution, calculates the propagation velocity at which the ultrasonic wave is propagated in the developing solution from the time and the distance $D_2$ determined, and outputs an output value [mV] proportional to the propagation velocity. Maps which show relationships between the specific gravity and the output value which are set in correspondence with the amount of photosensitive material F processed are stored in the control unit 26 which will be described later, and the control unit 26 selects the map in correspondence with the amount of photosensitive material F processed, and calculates the specific gravity on the basis of the selected map and the output value [mV] proportional to the detected propagation velocity.

Figure 3:
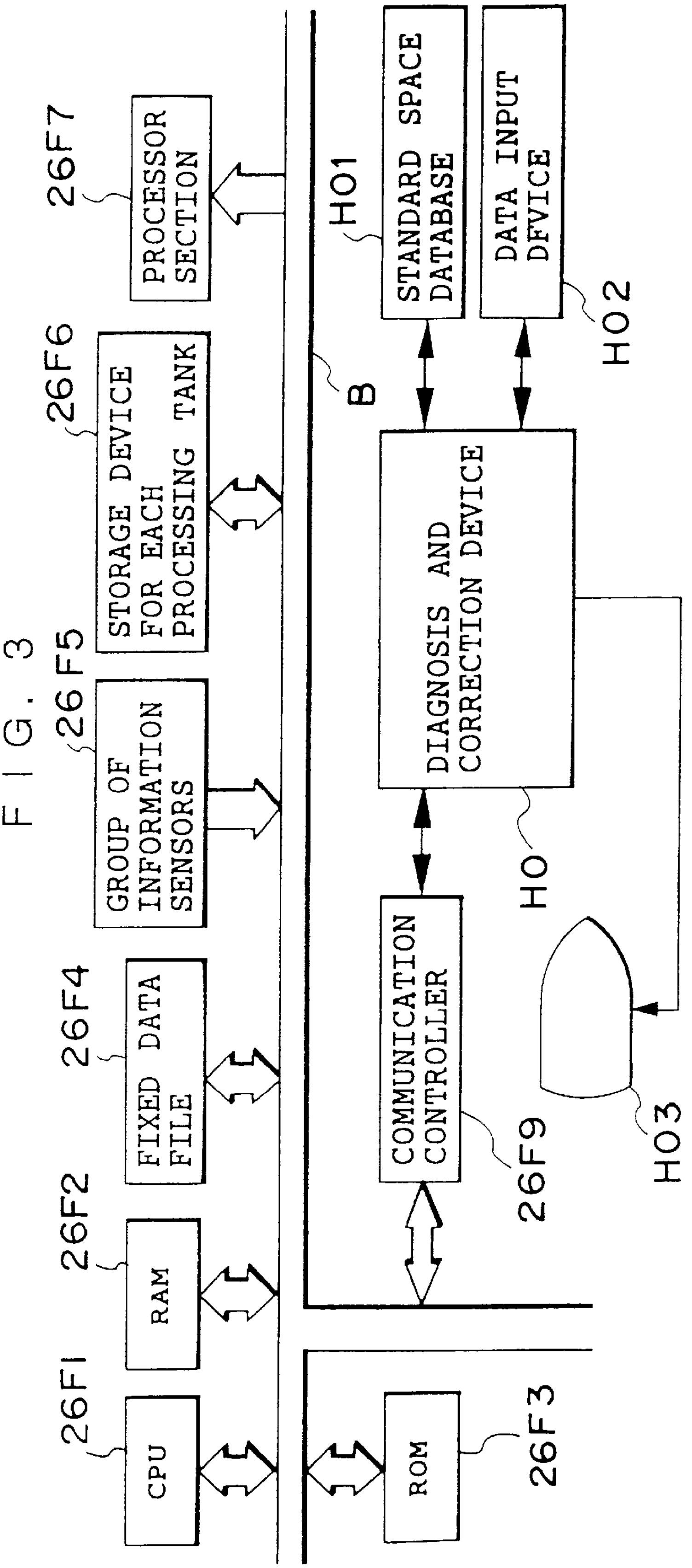
FIG. 3 is a block diagram of a control unit in accordance with the first embodiment.

The film processor 11 is provided with the control unit 26. As shown in FIG. 3, the control unit 26 has a CPU 26F1, a RAM 26F2, a ROM 26F3, and a bus B for mutually connecting them. Connected to the bus B are a memory 26F4 which stores unique data files of the film processor 11, a group of information sensors 26F5, a storage device 26F6 which stores the operating state and the like of the film processor 11 for each processing tank, and a processor section 26F7 of the film processor 11 for effecting various controls necessary for the development processing of the photosensitive material F.

The unique data files include a processor data file, a replenishing system data file, a squeegee system data file, an evaporation correction data file, a processing photosensitive material data file, a data file on various performances of the processing solutions, a data file on the thermal characteristics of the processing solutions, a data file on oxidation in the air of the processing solutions, a data file on faults of component parts, and a data file on finishing characteristics. It should be noted that all the respective items of data in these data files may be used, but all the items of data are not necessarily required.

It should be noted that the processor section 26F7 includes replenishing portions (the replenishing pumps 44F and the replenishing pumps 48L of the processing tanks) for replenishing the replenishing solutions and water for the processing solutions, temperature regulating portions (the circulating devices 30 of the processing tanks) for regulating and controlling the temperatures of the processing solutions, a storage portion for storing data other than the data of the unique data files and the data on the operating state of the film processor 11, a display portion (display panel 24) for displaying such as the states of the processing solutions, and the like, and so on.

Included in the group of information sensors 26F5 are, among others, the environment thermometer 54 for detecting the environmental temperature, the environment hygrometer 56 for detecting the environmental humidity, the temperature sensors for detecting the temperatures of the processing solutions, the pH sensors for detecting the pH, the hydrometers for detecting the specific gravities of the processing solutions, the level detectors for detecting the levels of the processing solutions, the infrared sensor unit 120 for detecting the amount of Ag remaining on the photosensitive material F, the infrared radiating unit 32F, unillustrated pump rotation sensors for detecting the amounts of rotation of the replenishing pumps provided in the respective processing tanks, the circulation flow meters 51 for measuring the amounts of the processing solutions circulated, and the replenishment flow meters 48F for measuring the amounts of water added to the respective processing tanks, these component parts being shown in FIGS. 1 and 2.

It should be noted that all of these information sensors may be used, but all of these information sensors are not necessarily required, one or more information sensors may be omitted, as necessary, and necessary information sensors may be further attached to necessary processing tanks. In addition, an arrangement may be provided such that data on characteristic values which are measured manually, as will be described later, are automatically measured by the information sensors.

Information on such as the time duration of each operating state as well as the environmental temperature, humidity, and processing solution temperature in each operating state is stored in the storage device 26F6. Here, the operating states include the stopped state, the standby state, and the driven state. The standby state is a state in which power is turned on for the film processor and the temperature regulation and control of the processing solutions is being performed, and it is a state in which the photosensitive material F is not being processed. In this state, since the respective circulation pumps operate and the temperatures are being regulated, the temperatures of the processing solutions are high, and it is a state in which deterioration by heat and oxidation in air are liable to progress. The driven state is a state in which, in addition to the standby state, the drying heater and the drying fan are operated, and the photosensitive material F is undergoing development, fixation, and wash processing, and a state equivalent to this state. In this state, the processing solutions are in the state of evaporating easily due to the effect of the drying air. When the photosensitive material F is actually processed, and the amount of the photosensitive material F processed reaches a predetermined value, the replenishing solutions in amounts corresponding to the type of photosensitive material F are replenished. Consequently, the waste solution due to overflow is discharged, or the carry-over of the processing solutions by the transport of the photosensitive material F occurs.

Then, the stopped state is the state persisting on a day of suspension of operation and during the nighttime, and it is a state in which the temperature regulation is stopped and the temperatures of the processing solutions have dropped. In this state, the processing solutions are in the state of being most difficult to deteriorate.

In addition, stored in the storage device 26F6 is information on such as the amount of photosensitive material F processed, the processing time, processing history, the amount of photosensitive material F exposed (feed back by the image density data), the type of fixing solution F, and the history of operation of the replenishment with the replenishing solutions (replenished amount and replenishing time). It should be noted that the data in the storage device 26F6 is stored for each processing tank. All of such information may be used by being stored in the storage device 26F6, but the storage of all of such information and use thereof are not necessarily required.

In addition, a diagnosis and correction device HO is connected to the bus B of the control unit 26 via a communication controller 26F9 and a bidirectional communication line, and the diagnosis and correction device HO, which is constituted by a computer, diagnoses the states of the processing solutions, and if the processing solutions are abnormal, the diagnosis and correction device HO corrects the processing solutions by controlling the processor section 26F7.

This diagnosis and correction device HO is provided outside the film processor, but may be incorporated in the film processor.

Connected to this diagnosis and correction device HO are a Mahalanobis space database HO1 which stores two databases, i.e., a database for a Mahalanobis space for the developing solution and a database for a Mahalanobis space for the fixing solution; a data input device HO2 for inputting data obtained by manually measuring the amount of primary developing agent, the amount of sulfite, the amount of halogen, and the like; and a display unit HO3 for displaying the degree of normality and the degree of abnormality.

Figure 4:
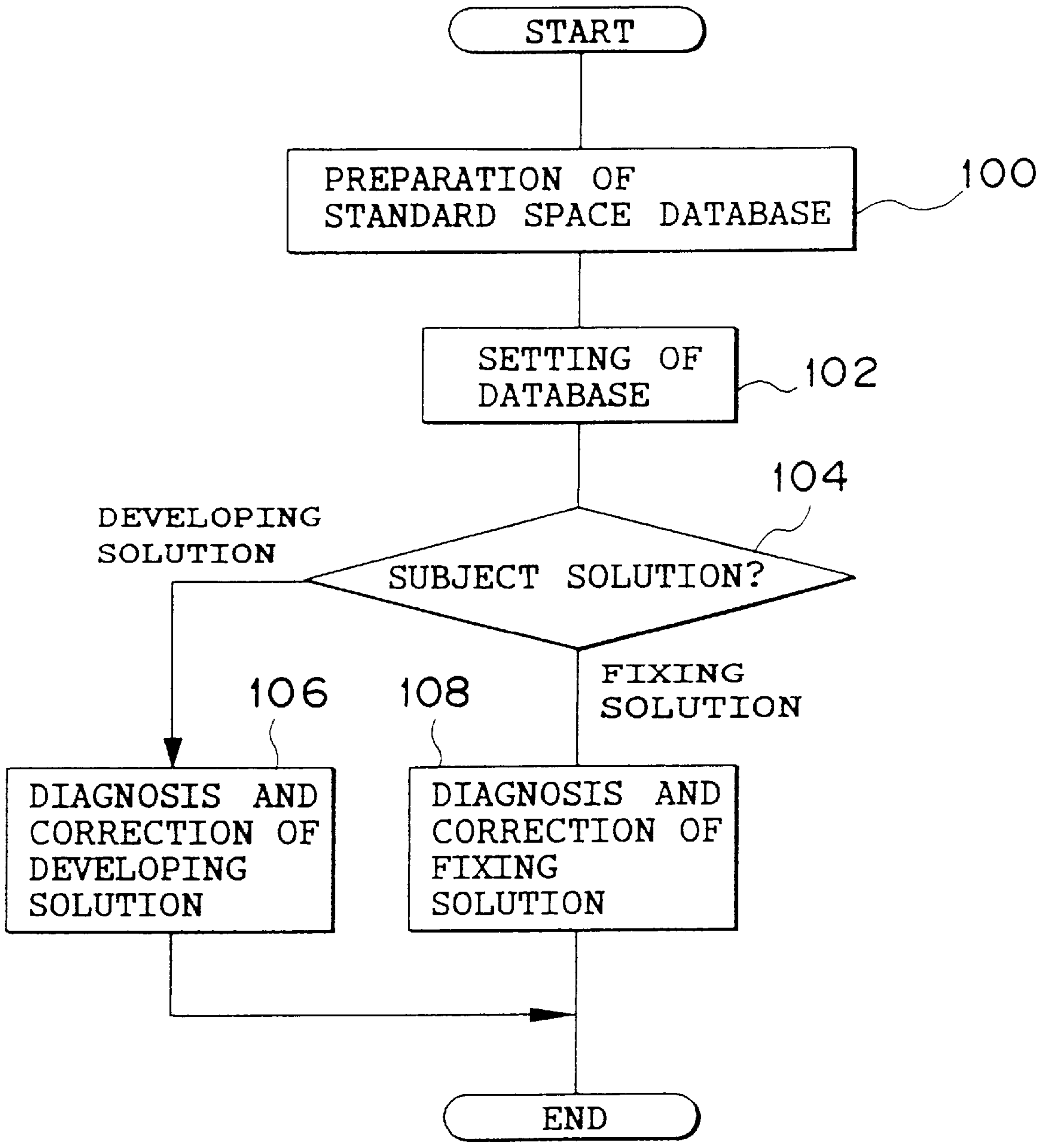
FIG. 4 is a flowchart illustrating a diagnosis and correction processing routine in accordance with the first embodiment.

Referring now to FIG. 4, a description will be given of a processing routine in the diagnosis and correction device in this embodiment. In Step 100, two databases, i.e., the database for the Mahalanobis space for the developing solution and the database for the Mahalanobis space for the fixing solution, are separately prepared by using data on the characteristic values in the normal state. In Step 102, the databases are set in the Mahalanobis space database HO1. Incidentally, as for the database, one database may be prepared for the developing solution and the fixing solution, and may be set in the Mahalanobis space database HO1.

In Step 104, the solution subject to diagnosis and correction is determined on the basis of the data instructed from the data input device HO2. If the solution subject to diagnosis and correction is the developing solution, the developing solution is subjected to diagnosis and correction processing in Step 106, while if the solution subject to diagnosis and correction is the fixing solution, the fixing solution is subjected to diagnosis and correction processing in Step 108.

A detailed description will be given of the preparation of the aforementioned Mahalanobis space database. With respect to the processing solution (either the developing solution or the fixing solution) for processing the photosensitive material, n sets (where n is an integer $\geqq 1$) of k (where k is an integer $\geqq 2$) kinds of characteristic values are detected.

As the characteristic values of the developing solution, it is possible to use the amount of processing per month ($m^2$/month), the type of processor, operating hours per day (hours/day), pH, specific gravity, the amount (g/l) of the primary developing agent (hydroquinone, ascorbic acid, or the like) in a unit developing solution, the amount (g/l) of sulfite ($Na_2SO_3$) in a unit developing solution, the amount (g/l) of compound A (5-methylbenzotriazole) in a unit developing solution, the amount (g/l) of compound B (sodium erythorbate) in a unit developing solution, the amount (g/l) of halogen (KBr) in a unit developing solution, and other characteristic values. Minimum and necessary characteristic values are the pH, specific gravity, the amount of primary developing agent, the amount of sulfate, and the amount of plate-making photosensitive material processed, and by using these characteristic values, it is possible to perform diagnosis and correction which cause no problems in practical use.

As the characteristic value data for the fixing solution, it is possible to use the amount of processing per month ($m^2$/month), the type of processor, operating hours per day (hours/day), pH, specific gravity, the amount (g/l) of sulfite ($Na_2SO_3$) in a unit fixing solution, the amount (ml/l) of thiosulfate ($(NH_4)_2S_2O_3$) in a unit fixing solution, the amount (g/l) of Ag in a unit fixing solution, the amount (g/l) of hydroquinone (HQ), and other characteristic values. Minimum and necessary characteristic values are the pH, the amount of sulfate, and the amount of thiosulfate.

It should be noted that as the developing solution and the fixing solution for which the characteristic values are determined, it is possible to use those which are prepared by diluting either a liquid agent or a solid agent with a predetermined amount of water.

A characteristic value $Y_{i,j}$ (where, i is the number of characteristic values, and i=1, 2, 3, . . . , k; and j is the number of sets of characteristic values, and j=1, 2, 3, . . . , n) detected is standardized as shown below, and a standardized characteristic value $y_{i,j}$ is calculated.

$$y_{i,j}=(Y_{i,j}-m_i)/\sigma_i \quad (1)$$

where $m_i$ is an average value concerning one characteristic value expressed by the formula below, and $\sigma_i$ is a standard deviation concerning one characteristic value.

$$m_i=(Y_{i,1}+Y_{i,2}+ \ldots +Y_{i,n})/n \quad \sigma_i^2=[(Y_{i,1}-m_i)^2+(Y_{i,2}-m_i(^2+ \ldots (Y_{i,n}-m_i)^2]/(n-1) \quad (2)$$

Next, a correlation matrix R having as its components correlation coefficients $r_{p,q}$ (where, p, q=1, 2, 3, . . . , k) between a p-th standardized characteristic value $y_p$ and a q-th standardized characteristic value $y_q$ among k standardized characteristic values $y_i$ of each set is determined, and an inverse matrix A (=$R^{-1}$) of the correlation matrix is determined from this correlation matrix R. The correlation matrix R and the inverse matrix A (=$R^{-1}$) of the correlation matrix are expressed as follows:

$$R = \begin{vmatrix} 1 & r_{12} & r_{13} & \cdots & r_{1k} \\ r_{21} & 1 & r_{23} & \cdots & r_{2k} \\ r_{31} & r_{32} & 1 & \cdots & r_{3k} \\ & \vdots & & & \\ \vdots & r_{pq} & \vdots & & \vdots \\ & \vdots & & & \\ r_{k1} & r_{k2} & r_{k3} & \cdots & 1 \end{vmatrix} \quad (3)$$

-continued $$A = R^{-1} = \begin{vmatrix} a_{11} & a_{12} & a_{13} & \cdots & a_{1k} \\ a_{21} & a_{22} & a_{23} & \cdots & a_{2k} \\ a_{31} & a_{32} & a_{33} & \cdots & a_{3k} \\ \vdots & \vdots & \vdots & & \vdots \\ a_{k1} & a_{k2} & a_{k3} & \cdots & a_{kk} \end{vmatrix}$$

The components of the inverse matrix A of this correlation matrix R are stored as the Mahalanobis space database for each processing solution. In addition, the Mahalanobis distance $MD^2$ at the point of time when a determination of the state is made can be calculated by the following formula by using the components $a_{pq}$ of the inverse matrix A of the correlation matrix R:

$$MD^2 = \frac{1}{k}\sum_{p,q=1}^{k} a_{pq} \cdot y_p \cdot y_q \quad (4)$$

If a specific description is given of the developing solution for the plate-making photosensitive material, as the characteristic value data for the developing solution, the following characteristic values were adopted: the amount of processing per month ($m^2$/month), the type of processor, operating hours per day (hours/day), the pH of the developing solution, the specific gravity of the developing solution, the amount (g/l) of HQ (hydroquinone) in a unit developing solution, the amount (g/l) of sulfite ($Na_2SO_3$) in a unit developing solution, the amount (g/l) of compound A (5-methylbenzotriazole) in a unit developing solution, the amount (g/l) of compound B (sodium erythorbate) in a unit developing solution, and the amount (g/l) of KBr in a unit developing solution.

When the characteristic values were selected to omit unnecessary characteristic values, the pH of the developing solution, the specific gravity of the developing solution, the amount of primary developing agent in the developing solution, the amount of sulfate in the developing solution, and the amount of plate-making photosensitive material processed were necessary at minimum. To cope with any complaints which may possibly arise in the future, however, it is preferable to use as the basic model a Mahalanobis space having all items as its objects.

In conducting the diagnosis and correction of the developing solution, as for those characteristic values that cannot be automatically detected by the group of information sensors, such characteristic values are analyzed by using an analyzer, and the analyzed data is inputted through the data input device HO2.

Figure 5:
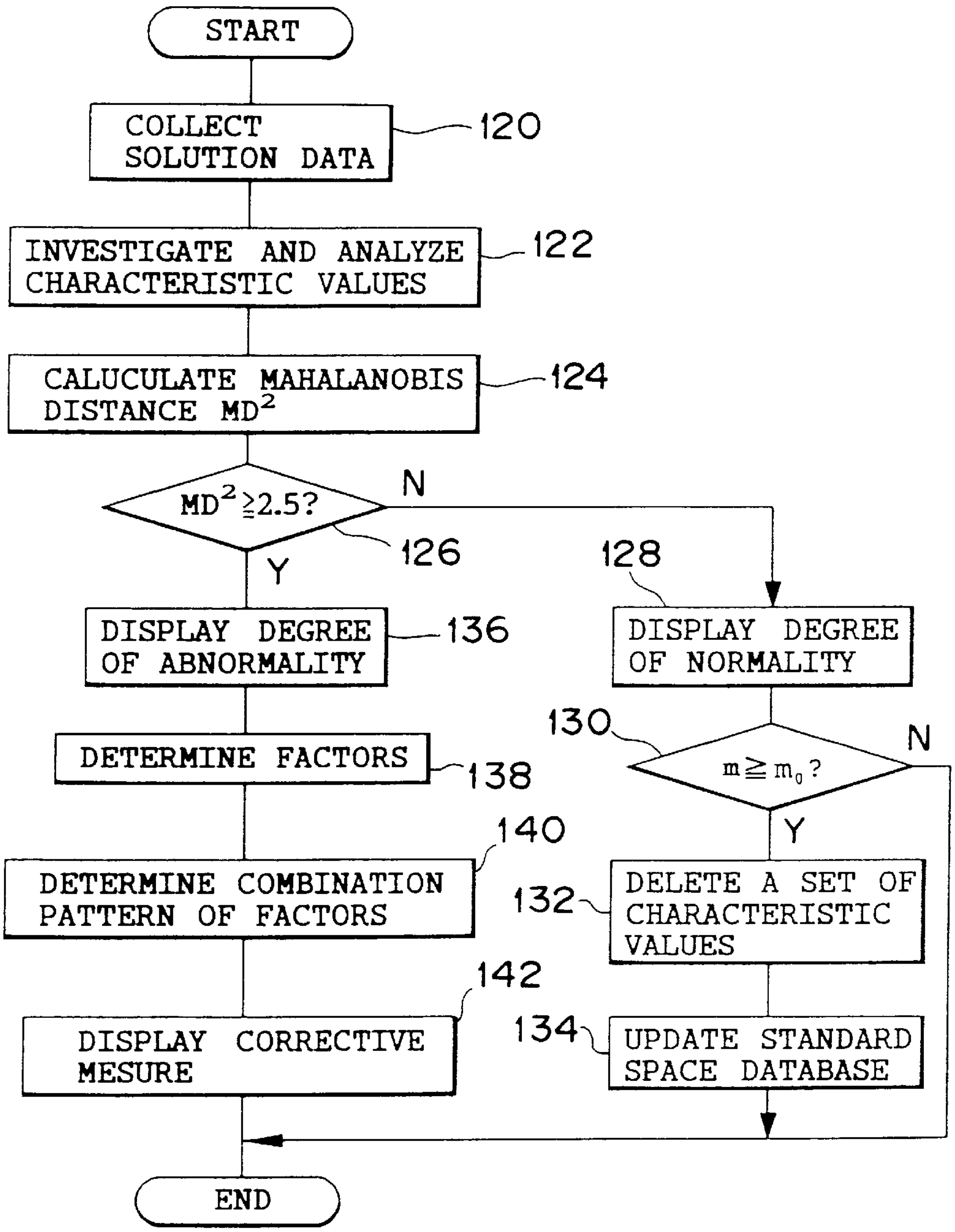
FIG. 5 is a flowchart illustrating a diagnosis and correction processing routine for each processing solution shown in FIG. 4.

Referring to FIG. 5, a description will be given of the details of Step 106 in FIG. 4. In Step 120, the type of process or, as well as the amount of plate-making photosensitive material processed per month, operating hours per day, pH, and specific gravity which were detected by the group of information sensors 26F5 are fetched. At the same time, the amount of primary developing agent in the unit developing solution, the amount of sulfate in the unit developing solution, the amount of compound A in the unit developing solution, the amount of compound B in the unit developing solution, the amount of KBr in the developing solution, and the like which were inputted through the data input device HO2 are fetched.

In a n ensuing Step 122, investigation and analysis of the characteristic values made up of the processing conditions and compositions of the solutions are effected.

In Step 122, the Mahalanobis distance is calculated in accordance with the above formulae, and in Step 126 a determination is made as to whether or not the Mahalanobis distance is greater than or equal to the threshold value (e.g., 2.5). If the Mahalanobis distance is less than the threshold value, the solution is determined to be normal, and in Step 128 the Mahalanobis distance is displayed on the display unit HO3. In Step 130, a determination is made as to whether or not the number of sets m of normal values has become greater than or equal to a predetermined value $m_0$ (e.g., a value which is greater by 1 than the number of sets when the Mahalanobis space database was prepared). If $m \geqq m_0$, in Step 132, the data of characteristic values in the oldest set in a time series is deleted to update the database. In Step 134, the database for the Mahalanobis space for the developing solution is updated by adding the set of data of the characteristic values newly detected to the data on the characteristic values in the normal state which was used in the preparation of the database for the Mahalanobis space for the developing solution on the previous occasion, and the database is set in the Mahalanobis space database HO1. On the other hand, if $m<m_0$, the routine ends without deleting the characteristic value data or updating the database for the Mahalanobis space for the developing solution.

each characteristic value. Then, those characteristic values for which the Mahalanobis distances in the case where characteristic values are present are greater than the Mahalanobis distances in the case where these characteristic values are not present and which have long straight lines are determined to be the factors.

In the ensuing Step 140, a combination pattern of the factors of characteristic values determined to be the factors of abnormality is determined. In Step 142, processing corresponding to the combination pattern is displayed.

Figure 6:
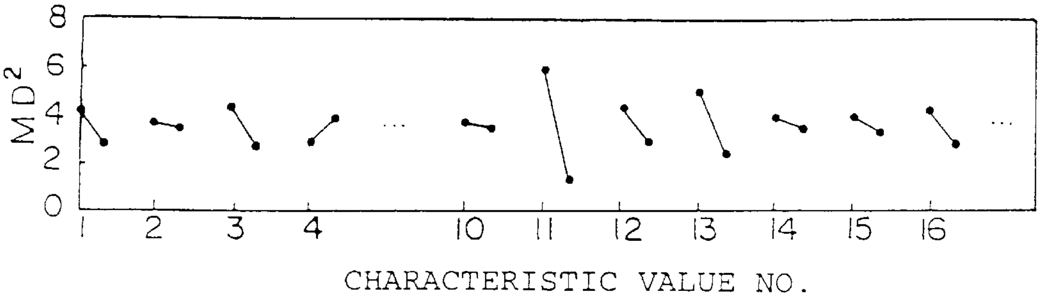
FIG. 6 is a diagram illustrating a factorial effect diagram for a developing solution for a plate-making photosensitive material.
Figure 7:
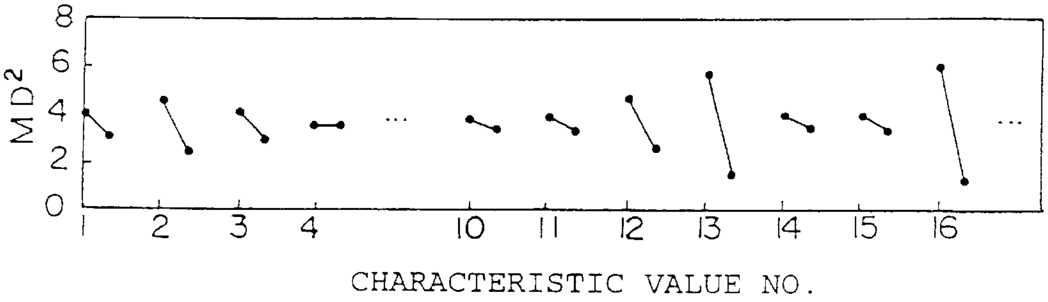
FIG. 7 is a diagram illustrating a factorial effect diagram for a developing solution for a plate-making photosensitive material.

Specific examples of the data on the characteristic values of the developing solution for the plate-making photosensitive material and data subject to analysis are shown in Table 3, and examples of the combination patterns of factors of abnormality in the case of the developing solution as well as corrective measures therefor are shown below. In addition, FIG. 6 shows a factorial effect diagram in a case where specific gravity, the amount of primary developing agent, and sulfate contribute as factors increasing the Mahalanobis distances, and FIG. 7 shows a factorial effect diagram in a case where the amount of primary developing agent, the amount of sulfate, and the amount of compound B contribute as factors increasing the Mahalanobis distances.

TABLE 3

<Developing Solution for Plate-Making Photosensitive Material>

| No. | 1 | 2 | 3 | 4 | | 10 | 11 | 12 | 13 | 14 | 15 | 16 | |
|---|---|---|---|---|---|---|---|---|---|---|---|---|---|
| Characteristic value Sample | Processor | Processing amount | Operating hours | Operating days | . . . | pH | Specific gravity | HQ | $Na_2SO_3$ | KBr | Compound A | Compound B | . . . |
| Unit | | $m^2$/month | hr/d | d/W | | | g/l | g/l | g/l | g/l | g/l | g/l | |
| Data 1 | D | 600 | 12 | 6 | | 10.5 | 1.142 | 28 | 72 | 7 | 0.2 | 2.7 | |
| Data 2 | A | 2000 | 16 | 5 | | 10.6 | 1.144 | 21 | 68 | 6.5 | 0.2 | 0.6 | |
| Data 3 | B | 1000 | 12 | 6 | | 10.5 | 1.144 | 29 | 79 | 6.5 | 0.2 | 3.7 | |
| Data 4 | C | 800 | 16 | 5 | | 10.6 | 1.183 | 39 | 93 | 8 | 0.2 | 2.7 | |
| Data 5 | A | 800 | 16 | 6 | | 10.5 | 1.178 | 33 | 87 | 9 | 0.2 | 2.5 | |
| Data 6 | B | 500 | 12 | 5 | | 10.4 | 1.136 | 26 | 76 | 7.5 | 0.2 | 3.7 | |
| Data 7 | D | 300 | 16 | 5 | | 10.4 | 1.155 | 23 | 70 | 8 | 0.1 | 1.8 | |
| | . | | | | | | | | | | | | |
| | . | | | | | | | | | | | | |
| | . | | | | | | | | | | | | |
| Data n | C | 300 | 16 | 5 | | 10.5 | 1.193 | 22 | 79 | 9 | 0.3 | 1.7 | |
| Analysis 1 | D | 200 | 24 | 6 | | 10.6 | 1.247 | 40 | 131 | 10.5 | 0.3 | 4.9 | |
| Analysis 2 | A | 200 | 16 | 5 | | 10.5 | 1.207 | 22 | 75 | 9 | 0.2 | 0.5 | |
| Analysis 3 | A | 500 | 12 | 5 | | 10.6 | 1.217 | 46 | 122 | 8 | 0.3 | 5.6 | |

On the other hand, if the Mahalanobis distance is greater than or equal to the predetermined value, a determination is made that the developing solution has become abnormal, and the calculated Mahalanobis distance is displayed on the display unit HO3 in Step 136 to display the degree of abnormality. Then, in Step 138, factors which led to the abnormality are determined.

In the determination of factors, a factorial effect diagram is prepared by calculating the Mahalanobis distances with respect to the respective characteristic values, and the characteristic values with large Mahalanobis distances are determined to be the factors which caused the abnormality.

In this factorial effect diagram, the characteristic value is taken as the abscissa, the Mahalanobis distance is taken as the ordinate, the Mahalanobis distance (left-hand side) in a case where the characteristic value is present in each characteristic value and the Mahalanobis distance (right-hand side) in a case where the characteristic value is not present are plotted for each characteristic value, and the plotted points are shown by being connected by a straight line for Examples of the combination patterns of factors in the case of the developing solution for the plate-making photosensitive material as well as corrective measures therefor are shown below.

(1) Case Where Specific Gravity Is Particularly Abnormal

A determination is made that the solution is tending to be concentrated, the dilution ratio setting condition and an actual dilution ratio are checked, and the dilution ratio is reset so that the dilution ratio becomes the actual setting or becomes slightly greater than the same.

Incidentally, if the Mahalanobis distance exceeds 4.0, a predetermined amount of water is supplied as an emergency measure to dilute the developing solution.

(2) Case Where the Amount of Primary Developing Agent, the Amount of Sulfate, and the Amount of Compound B Are Abnormal A determination is made that the solution is in the state of oxidation in air, the replenishing conditions and the actual replenishment amount are checked, and if the replenishment amount is insufficient, the amount of replenishment is reset so that the amount of replenishment increases.

As the characteristic values of the fixing solution for the plate-making photosensitive material, the following characteristic values were used: the type of processor, the amount of processing per month ($m^2$/month), operating hours per day (hours/day), operating days per week (days/week), pH, the amount (ml/l) of thiosulfate ($(NH_4)_2S_2O_3$) in a unit fixing solution, the amount (g/l) of sulfite ($Na_2SO_3$), the amount (g/l) of Ag, and the amount (g/l) of HQ.

Figure 8:
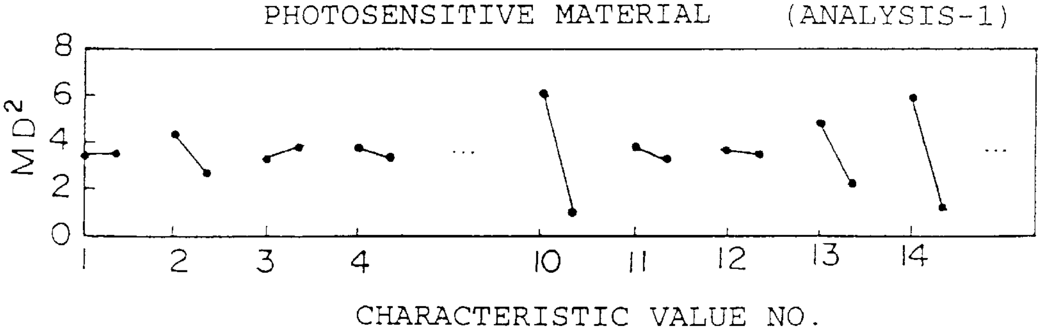
FIG. 8 is a diagram illustrating a factorial effect diagram for a fixing solution for a plate-making photosensitive material.

Specific examples of the data on the characteristic values of the fixing solution for the plate-making photosensitive material and data subject to analysis are shown in Table 4, and examples of the combination patterns of factors of abnormality in the case of the fixing solution as well as corrective measures therefor are shown below. In addition, FIG. 8 shows a factorial effect diagram in a case where pH, the amount of Ag, and the amount of HQ became abnormal.

TABLE 4

<Fixing Solution for Plate-making Photosensitive Material>

| No. | 1 | 2 | 3 | 4 | | 10 | 11 | 12 | 13 | 14 | |
|---|---|---|---|---|---|---|---|---|---|---|---|
| Characteristic value Sample | Processor | Processing amount | Operating hours | Operating days | . . . | pH | Ammonium thiosulfate (75%) | $Na_2SO_3$ g/l | Amount of Ag | Amount of HQ | . . . |
| Unit | | $m^2$/month | hr/d | d/W | | | g/l | g/l | g/l | g/l | |
| Data 1 | D | 600 | 12 | 5 | | 4.96 | 173 | 23 | 5.4 | 1.7 | |
| Data 2 | A | 2000 | 16 | 5 | | 5.05 | 194 | 23 | 9.5 | 1.4 | |
| Data 3 | B | 1000 | 12 | 6 | | 5.03 | 175 | 20 | 9.4 | 1.7 | |
| Data 4 | C | 800 | 16 | 5 | | 5.11 | 180 | 23 | 7.9 | 4.1 | |
| Data 5 | A | 800 | 16 | 6 | | 5.24 | 215 | 24 | 11.4 | 2.9 | |
| Data 6 | B | 500 | 12 | 5 | | 5.12 | 187 | 23 | 8.6 | 2.6 | |
| Data 7 | D | 300 | 16 | 5 | | 5.04 | 183 | 22 | 9 | 1.9 | |
| Data 8 | C | 400 | 16 | 6 | | 5.16 | 182 | 22 | 9.3 | 4.0 | |
| Data 9 | B | 100 | 12 | 5 | | 5.09 | 196 | 22 | 3.6 | 2.3 | |
| Data 10 | C | 200 | 24 | 6 | | 4.90 | 178 | 22 | 2.5 | 1.3 | |
| Analysis 1 | A | 150 | 16 | 6 | | 5.23 | 213 | 28 | 11.3 | 4.6 | |
| Analysis 2 | C | 200 | 12 | 5 | | 5.21 | 218 | 27 | 9.1 | 3.5 | |

Examples of the combination patterns of factors in the case of the fixing solution for the plate-making photosensitive material as well as corrective measures therefor are shown be low.

(1) Case Where pH, Ag Amount, and HQ Amount Are Abnormal

A determination is made that the amount of carry-over of developing solution from the developing tank has increased, the amount of replenishment is checked, and a necessary amount of replenishment is reset.

(2) Case Where the Amount of Thiosulfate and the Amount of Sulfate Are Abnormal

A determination is made that the solution is tending to be concentrated, the amount of replenishment and the dilution ratio are checked, and the dilution ratio is reset when correction is required.

In a second embodiment, the present invention is applied to a case in which the states of various processing solutions including the developing solution, fixing solution, and bleaching solution which are used in a film processor for developing and processing a color film are determined, and the processing solutions are corrected in correspondence with the states of the processing solutions.

Figure 9:
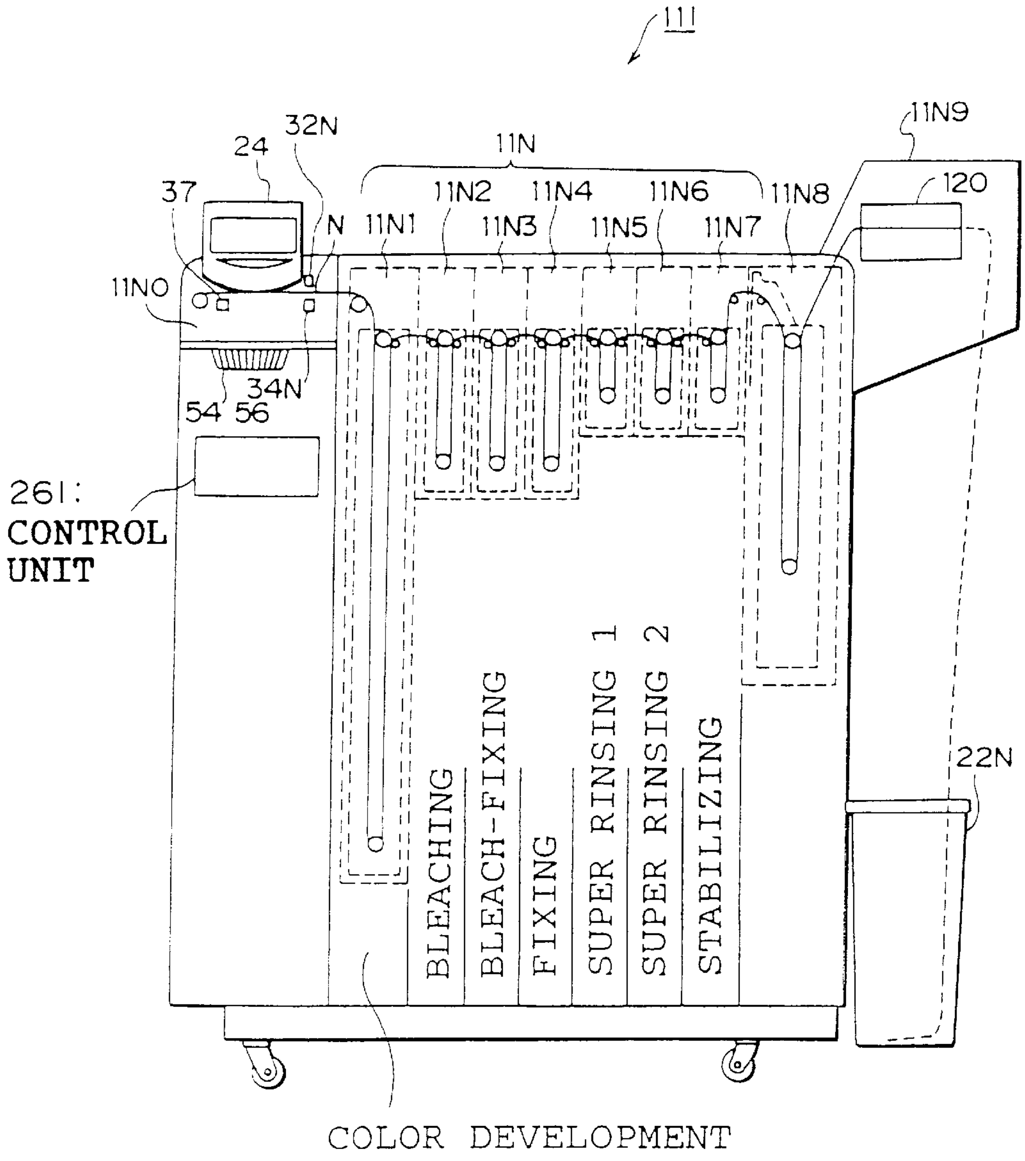
FIG. 9 is a schematic diagram of a film processor in accordance with a second embodiment of the present invention.

As shown in FIG. 9, a film processor 111 has a loading section 11N0 for loading a color negative film N. The negative film N with images exposed thereon after being photographed is loaded in this loading section 11N0, and the loaded negative film N is transported into a processor section 11N.

Processing tanks including a color development processing tank 11N1, a bleach processing tank 11N2, a bleach-fix processing tank 11N3, a fixation processing tank 11N4, super rinse processing tanks 11N5, 11N6, and a stabilization processing tank 11N7 are sequentially disposed in the processor section 11N, and a color development processing solution, a bleaching solution, a bleach-fixing solution, a fixing solution, and a super rinsing solution (washing water), and a stabilizing solution are sequentially stored in the processing tanks, respectively. In addition, the respective processing tanks are provided with upper rollers and lower rollers, which form a transporting path between adjacent processing tanks and through the processing tanks. The negative film N is transported by the upper and lower rollers so as to pass through the respective processing tanks, and when it passes through each processing tank, the negative film N is immersed in each processing solution and is thereby subjected to processing.

In addition, a drying section 11N8 is disposed adjacent to the processor section 11N. The drying section 11N8 dries the negative film N by reciprocally transporting the negative film N in the vertical direction. Then, as for the negative film N, a leader bonded to a leading end of the negative film N is retained by an unillustrated hanger in a film-leader accumulating portion 11N9, and its rear-end side is accommodated in an accommodating box 22N (see the broken line in FIG. 9).

The loading section 11N0 is provided with the environment thermometer 54 for detecting the environmental temperature, the environment hygrometer 56, a code reading sensor 37 for reading a bar code and an DX code recorded on the negative film N, and a photosensitive-material detecting sensor which is comprised of an infrared radiating unit 32N and an infrared detecting unit 34N. The infrared radiating unit 32N is form ed by arranging a plurality of infrared radiating elements in a direction perpendicular to the transporting direction of the negative film N (in the widthwise direction of the negative film N), while the infrared detecting unit 34N is formed such that a plurality of detecting elements for detecting the infrared rays radiated from the infrared radiating elements are arranged in the direction perpendicular to the transporting direction X of the negative film N. In addition, a gap allowing the negative film N to pass therethrough is provided between the infrared radiating unit 32N and the infrared detecting unit 34N. When the negative films in roll form connected by splicing tape pass therethrough, the infrared rays are shut off by the splicing tape, so that by counting the number of detections of the splicing tape by a control unit 26, which will be described later, on the basis of a signal outputted from a splice sensor, it is possible to detect the amount of negative film processed, i.e., the number of negative films processed per unit time (e.g. one day).

The display panel 24 formed by a liquid-crystal display unit is provided on top of the loading section 11N0, and the infrared sensor unit 120 for detecting the amount of Ag remaining on the negative film N is provided in the film-leader accumulating portion 11N9.

The infrared sensor unit 120 is formed by an infrared radiating diode and a photodiode disposed in face-to-face relation to the infrared radiating diode, and outputs a signal responsive to the amount of Ag remaining on the negative film N on the basis of an output of the photodiode by making use of the fact that the amount of transmission of infrared rays transmitted through the negative film N varies depending on the amount of remaining Ag. A control unit 261, which will be described later, detects the residual amount of Ag on the negative film on the basis of the output from the infrared sensor unit 120, and detects amount of Ag dissolved in the fixing solution by subtracting the residual amount of Ag from a known amount of Ag coated on the negative film.

Since the aforementioned processing tanks 11N1 to 11N7 have substantially identical configurations, a description will be given of the color development processing tank 11N1, and a description of the other processing tanks 11N2 and 11N7 will be omitted.

Figure 10:
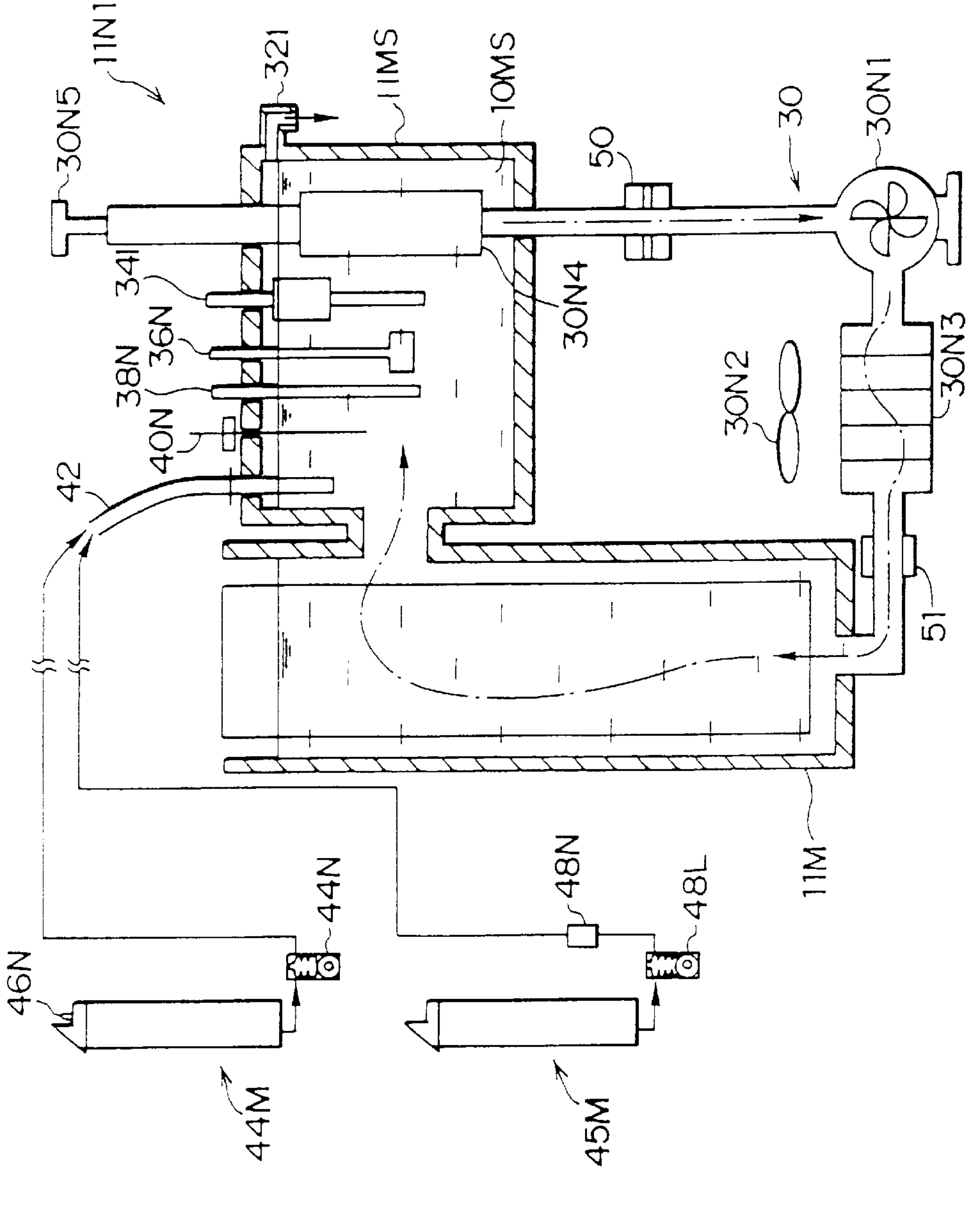
FIG. 10 is a cross-sectional view illustrating the configuration of a color development processing tank in accordance with the second embodiment.

As shown in FIG. 10, the color development processing tank 11N1 has the processing tank 11M in which a color developing solution is stored, the subtank 11MS communicating with the processing tank 11M, the replenishing tank 44M in which the replenishing solution for replenishing the subtank 11MS is stored, and the water replenishing tank 45M in which water for replenishing the subtank 11MS is stored.

The subtank 11MS is connected to the replenishing tank 44M so as to allow the replenishing solution to be replenished through the replenishing nozzle 42 and a replenishing pump 44N, and is connected to the water replenishing tank 45M so as to allow water to be replenished through the replenishing nozzle 42 and the replenishing pump 48L.

The replenishing tank 44M is provided with an ultrasonic level meter 46N for detecting the level of the replenishing solution in the replenishing tank 44M. A water supply pipe connected to the water replenishing tank 45M is provided with a water flow meter 48N for detecting the volume of water supplied through the replenishing pump 48L.

Further, the subtank 11MS is provided with a temperature sensor 40N for detecting the temperature of the color developing solution in the subtank 11MS, a pH sensor 38N for detecting the pH of the color developing solution, a hydrometer 36N for detecting the specific gravity of the color developing solution, and a level detector 341 for detecting the level of the color developing solution. Incidentally, reference numeral 321 denotes a discharge port for allowing unnecessary color developing solution to overflow as a waste solution. This waste solution is stored in an unillustrated waste solution tank.

The color development processing tank 11N1 is further provided with the circulating device 30 which allows the color developing solution stored in the processing tank 11M and the subtank 11MS to circulate from the processing tank 11M toward the subtank 11MS, as shown by the broken line. This circulating device 30 is comprised of a circulating pump 30N1, a cooling fan 30N2, a heater 30N3, the circulation flow meter 51, a filter mounting rod 30N5, and a circulation filter 30N4. The temperature of the color developing solution is regulated under feedback control by this circulating device 30 so as to become the set temperature (the temperature for appropriately processing the negative film N (e.g., 38 [°C.]).

The electric conductivity meter 50 of a coil type is provided on a pipe extending from the circulation filter 30N4 to an inlet of the circulation pump 30N1. It should be noted that, as the electric conductivity meter, it is possible to use an electric conductivity meter in which a voltage is applied across a plurality of electrodes to measure electric conductivity.

The hydrometer 36N determines time required for an ultrasonic wave to be propagated a predetermined distance $D_2$ in the color developing solution, calculates the propagation velocity at which the ultrasonic wave is propagated in the color developing solution from the time and the distance $D_2$ determined, and outputs an output value [mV] proportional to the propagation velocity. Maps which show relationships between the specific gravity and the output value which are set in correspondence with the amount of negative film N processed (the number of films processed) are stored in the control unit 261 which will be described later, and the control unit 261 selects the map in correspondence with the amount of negative film N processed, and calculates the specific gravity on the basis of the selected map and the output value [mV] proportional to the detected propagation velocity.

Figure 11:
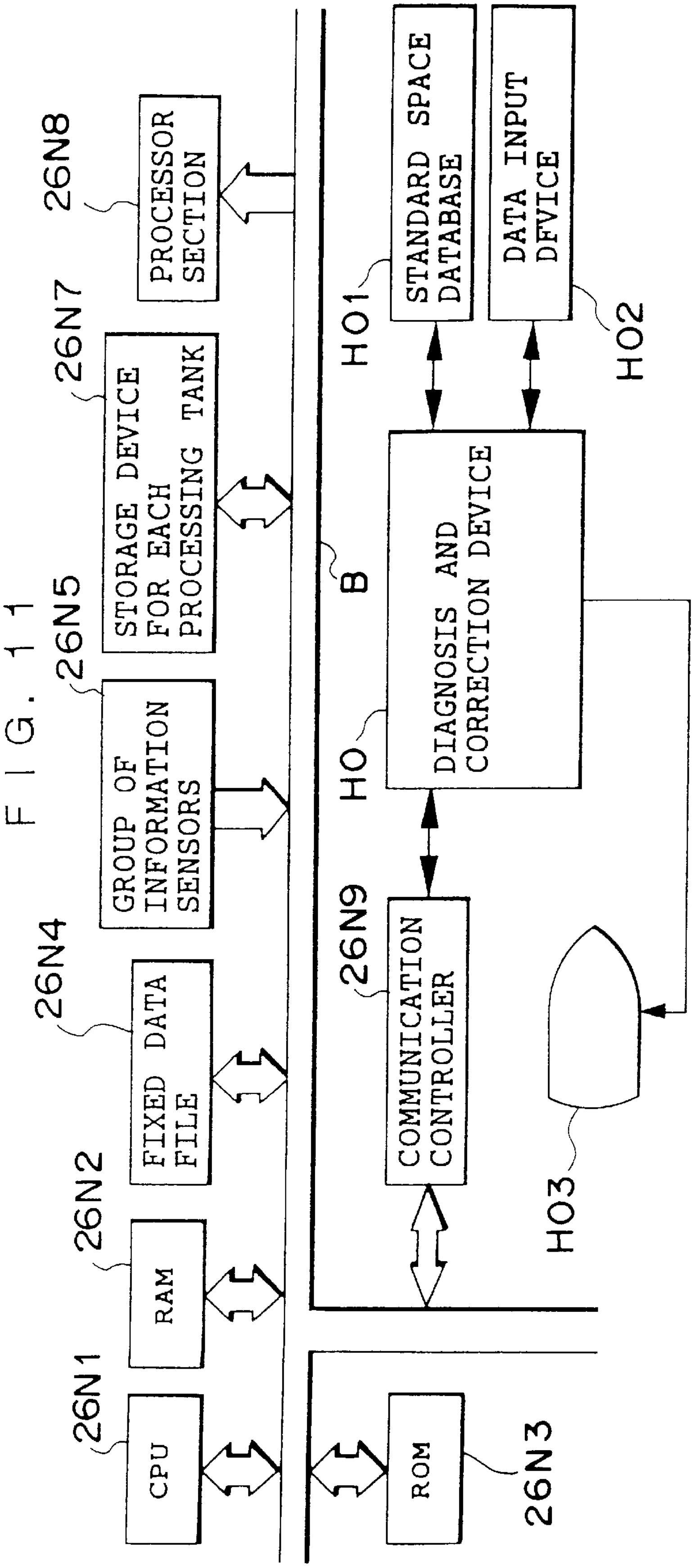
FIG. 11 is a block diagram of the control unit in accordance with the second embodiment.

As shown in FIG. 11, the control unit 261 provided in the film processor 111 has a CPU 26N1, a RAM 26N2, a ROM 26N3, and the bus B for mutually connecting them. Connected to the bus B are a memory 26N4 which stores unique data files of the film processor 111, a group of information sensors 26N5, a storage device 26N6 which stores operating state and the like of the film processor 111 for each processing tank, and a processor section 26N7 of the film processor 111 for effecting various control necessary for the development processing of the negative film N.

The unique data files include a processor data file, a replenishing system data file, a squeegee system data file, an evaporation correction data file, a processing photosensitive material data file, a data file on various performances of processing solutions, a data file on thermal characteristics of processing solutions, a data file on oxidation in air of processing solutions, a data file on faults of component parts, and a data file on finishing characteristics. It should be noted that all the respective items of data in these data files may be used, but all the items of data are not necessarily required.

It should be noted that the processor section 26N7 includes replenishing portions (the replenishing pumps 44N and the replenishing pumps 38L of the processing tanks) for replenishing the replenishing solutions and water for the processing solutions, temperature regulating portions (the circulating devices 30 of the processing tanks) for regulating and controlling the temperatures of the processing solutions, a storage portion for storing data other than the data of the unique data files and the data on the operating state of the film processor 111, a display portion (display panel 24) for displaying information such as the states of the processing solutions, and so on.

Included in the group of information sensors 26N5 are, among others, the environment thermometer 54 for detecting the environmental temperature, the environment hygrometer 56 for detecting the environmental humidity, the temperature sensors for detecting the temperatures of the processing solutions, the pH sensors for detecting the pH, the hydrometers for detecting the specific gravities of the processing solutions, the level detectors for detecting the levels of the processing solutions, the infrared sensor unit 120 for detecting the amount of Ag remaining on the negative film N, the code reading sensor 37 for reading a bar code and a DX code recorded on the negative film N, the infrared radiating unit 32N, unillustrated pump rotation sensors for detecting the amounts of rotation of the replenishing pumps provided in the respective processing tanks, the circulation flow meters 51 for measuring the amounts of the processing solutions circulated, and the replenishment flow meters 48N for measuring the amounts of water added to the respective processing tanks, these component parts being shown in FIGS. 9 and 10.

It should be noted that all of these information sensors may be used, but all of these information sensors are not necessarily required, one or more information sensors may be omitted, as necessary, and necessary information sensors may be further attached to necessary processing tanks. In addition, an arrangement may be provided such that data on characteristic values which are measured manually, as will be described later, are automatically measured by the information sensors.

Information such as the time duration of each operating state as well as the environmental temperature, humidity, and processing solution temperature in each operating state is stored in the storage device 26N6. Here, the operating states include the stopped state, the standby state, and the driven state. The standby state is a state in which power is turned on for the film processor and the temperature regulation and control of the processing solutions is being performed, and it is a state in which the negative film N is not being processed. In this state, since the respective circulation pumps operate and the temperatures are being regulated, the temperatures of the processing solutions are high, and it is a state in which deterioration by heat and oxidation in air are liable to progress. The driven state is a state in which, in addition to the standby state, the drying heater and the drying fan are operated, and the negative film N is undergoing development, fixation, and wash processing, and a state equivalent to this state. In this state, the processing solutions are in the state of evaporating easily due to the effect of the drying air. When the negative film N is actually processed, and the amount of the negative film N processed reaches a predetermined value, the replenishing solutions in amounts corresponding to the type of negative film N are replenished. Consequently, the waste solution due to overflow is discharged, or the carry-over of the processing solutions by the transport of the negative film N occurs. Further, with respect to the rinsing solution (washing water), cascade processing is performed for the sake of efficiency of the processing performance.

The stopped state is the state persisting on a day of suspension of operation and during the nighttime, and it is a state in which the temperature regulation is stopped and the temperatures of the processing solutions have dropped. In this state, the processing solutions are in the state of being most difficult to deteriorate.

In addition, stored in the storage device 26N6 is information such as the amount of negative film N processed, the processing time, processing history, the amount of negative film N exposed (fed back by the image density data), the type of negative film N, and the history of operation of the replenishment with the replenishing solutions (replenished amount and replenishing time). It should be noted that the data in the storage device 26N6 is stored for each processing tank. All of such information may be used by being stored in the storage device 26N6, but the storage of all of such information and use thereof are not necessarily required.

In addition, the diagnosis and correction device HO is connected to the bus B of the control unit 26 via a communication controller 26N9 and a bidirectional communication line, and the diagnosis and correction device HO, which is constituted by a computer, diagnoses the states of the processing solutions, and if the processing solutions are abnormal, the diagnosis and correction device HO corrects the processing solutions by controlling the processor section 26N7.

It should be noted that in the case where a printer-processor, which will be described later, is provided in a subsequent stage, the diagnosis and correction device HO is connected to the printer-processor through the communication controller 26N9, and the diagnosis and correction of the film processor and the printer-processor may be conducted at the same time. This diagnosis and correction device HO is provided outside the film processor, but may be incorporated in the film processor or in the printer-processor.

Connected to this diagnosis and correction device HO are the Mahalanobis space database HO1 which stores three databases, i.e., a database for a Mahalanobis space for the developing solution, a database for a Mahalanobis space for the fixing solution, and a database for a Mahalanobis space for the bleaching solution; the data input device HO2 for inputting data obtained by manually measuring the amount of primary developing agent, the amount of sulfite, the amount of halogen, the amount of 1.3PDTA-Fe (1,2-propylenediamine tetra-acetic acid-iron complex), the amount of EDTA-Fe (ethylene diamine tetra-acetic acid-iron complex), and the like; and the display unit HO3 for displaying the degree of normality and the degree of abnormality.

Figure 12:
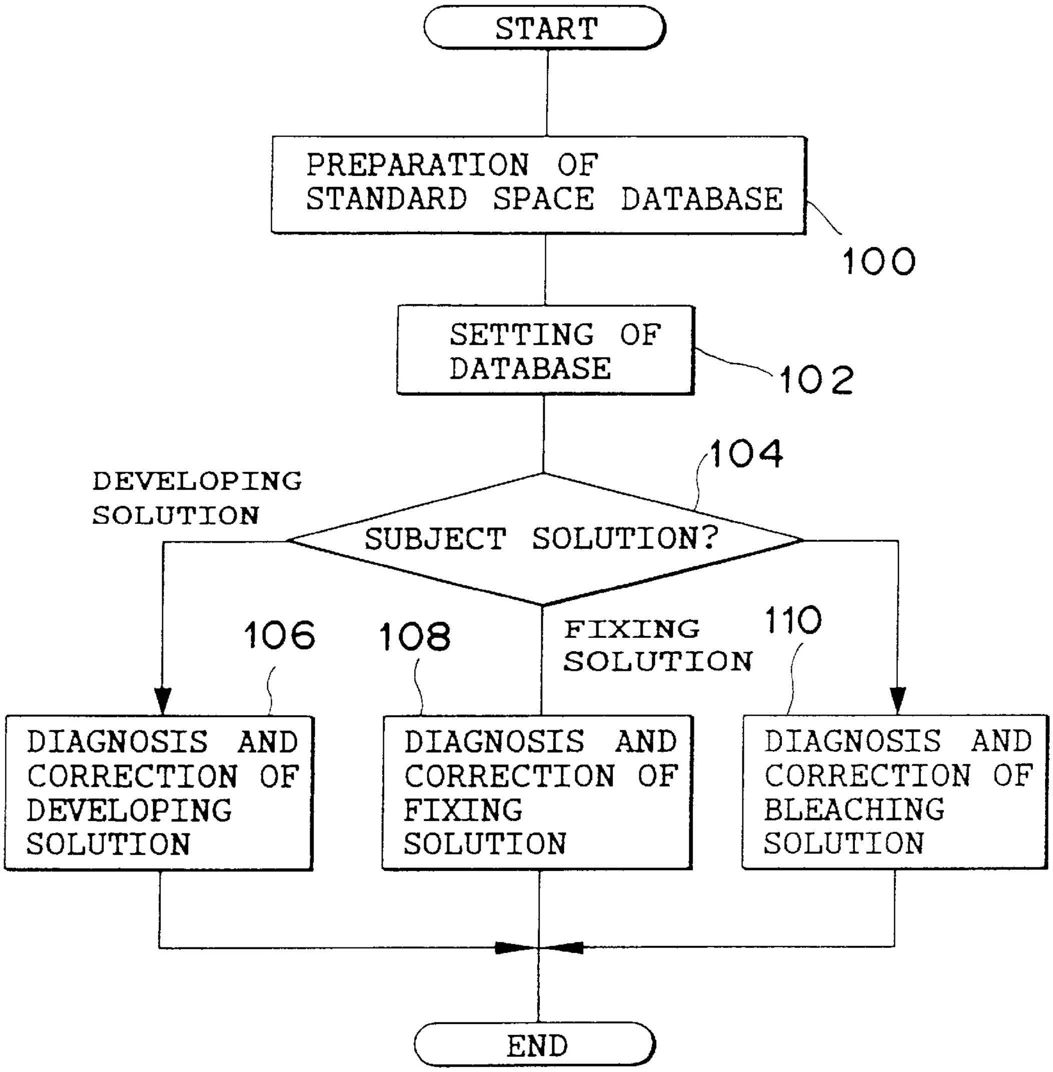
FIG. 12 is a flowchart illustrating a diagnosis and correction processing routine in accordance with the second embodiment.

Referring now to FIG. 12, a description will be given of a processing routine in the diagnosis and correction device in this embodiment. It should be noted that, in FIG. 12, portions corresponding to those of FIG. 4 are denoted by the same reference characters to give a description. In Step 100, three databases, i.e., the database for the Mahalanobis space for the developing solution, the database for the Mahalanobis space for the fixing solution, and the database for the Mahalanobis space for the fixing solution, are separately prepared by using data on the characteristic values in the normal state. In Step 102, the databases are set in the Mahalanobis space database HO1. Incidentally, as for the database, one database may be prepared for the developing solution, the fixing solution, and the bleaching solution, and may be set in the Mahalanobis space database HO1.

In Step 104, the solution subject to diagnosis and correction is determined on the basis of the data instructed from the data input device HO2. If the solution subject to diagnosis and correction is the developing solution, the developing solution is subjected to diagnosis and correction processing in Step 106; if the solution subject to diagnosis and correction is the fixing solution, the fixing solution is subjected to diagnosis and correction processing in Step 108; and if the solution subject to diagnosis and correction is the bleaching solution, the bleaching solution is subjected to diagnosis and correction processing in Step 110.

A detailed description will be given of the preparation of the aforementioned Mahalanobis space database. With respect to the processing solution (one of the developing solution, the fixing solution, and the bleaching solution) for processing the color negative film, n sets (where n is an integer$\geqq$1) of k (where k is an integer$\geqq$2) kinds of characteristic values are detected.

As the characteristic values of the developing solution, it is possible to use the amount of processing per day ($m^2$/day), the type of processor, operating hours per day (hours/day), pH, specific gravity, the amount (g/l) of the primary developing agent (hydroquinone, 2-methyl-4-[N-ethyl-N-(β-hydroxyethyl)amino]aniline) in a unit developing solution, the amount (g/l) of sulfite ($Na_2SO_3$) in a unit developing solution, the amount (g/l) of HAS (hydroxylamine sulfate)

in a unit developing solution, the amount (g/l) of AF3 (disodium-N,N-bis(sulfonate ethyl)hydroxylamine) in a unit developing solution, the amount (g/l) of halogen (KBr) in a unit developing solution, the amount (g/l) of Fe in a unit developing solution, and other characteristic values. Minimum and necessary characteristic values are the pH, specific gravity, the amount of primary developing agent, the amount of sulfate, and the amount of halogen, and by using these characteristic values, it is possible to perform diagnosis and correction which cause no problems in practical use.

As the characteristic value data for the fixing solution, it is possible to use the amount of processing per day (films/day), the type of processor, operating hours per day (hours/day), pH, specific gravity, the amount (g/l) of sulfite ($Na_2SO_3$) in a unit fixing solution, the amount (ml/l) of thiosulfate ($(NH_4)_2S_2O_3$ (ATS)) in a unit fixing solution, the amount (g/l) of Ag in a unit fixing solution, the amount (g/l) of 1.3PDTA-Fe, and other characteristic values. Minimum and necessary characteristic values are the pH, the amount of sulfate, the amount of thiosulfate, and the amount of Ag.

As the characteristic value data for the bleaching solution, it is possible to use the amount of processing per day (films/day), the type of processor, operating hours per day (hours/day), pH, specific gravity, the amount (g/l) of 1.3PDTA-Fe, the amount of KBr, and other characteristic values. Minimum and necessary characteristic values are the pH, the amount of halogen, and the amount of 1.3PDTA-Fe.

A characteristic value $Y_{i,j}$ (where, i is the number of characteristic values, and i=1, 2, 3, . . . , k; and j is the number of sets of characteristic values, and j=1, 2, 3, . . . , n) detected is standardized as shown in Formula (1) above, and a standardized characteristic value $y_{i,j}$ is calculated.

Next, a correlation matrix R having as its components correlation coefficients $r_{p,q}$ (where, p, q=1, 2, 3, . . . , k) between a p-th standardized characteristic value $y_p$ and a q-th standardized characteristic value $y_q$ among k standardized characteristic values $y_i$ of each set is determined, and an inverse matrix A ($=R^{-1}$) of the correlation matrix is determined from this correlation matrix R. The correlation matrix R and the inverse matrix A ($=R^{-1}$) of the correlation matrix are expressed as shown in Formula (3) above.

The components of the inverse matrix A of this correlation matrix R are stored as the Mahalanobis space database for each processing solution. In addition, the Mahalanobis distance $MD^2$ at the point of time when a determination of the state is made can be calculated by using the components $a_{pq}$ of the inverse matrix A of the correlation matrix R in accordance with Formula (4) above.

If a specific description is given of the developing solution for the film processor, a s the characteristic value data for the developing solution, the following characteristic values were adopted: the amount of processing per day (films/day), the type of processor, operating hours per day (hours/day), the pH of the developing solution, the specific gravity of the developing solution, the amount (g/l) of the primary developing agent (hydroquinone, 2-methyl-4-[N-ethyl-N-(β-hydroxyethyl)amino]aniline) in a unit developing solution, the amount (g/l) of sulfite ($Na_2SO_3$) in a unit developing solution, the amount (g/l) of HAS (hydroxylamine sulfate) in a unit developing solution, the amount (g/l) of AF3 (disodium-N,N-bis(sulfonate ethyl) hydroxylamine) in a unit developing solution, and the amount (g/l) of Fe in a unit developing solution.

When the characteristic values were selected to omit unnecessary characteristic values, the pH of the developing solution, the specific gravity of the developing solution, the amount of primary developing agent in the developing solution, the amount of sulfate in the developing solution, and the amount of halogen in the developing solution were necessary at minimum. To cope with any complaints which may possibly arise in the future, however, it is preferable to use as the basic model a Mahalanobis space having all items as its objects.

In conducting the diagnosis and correction of the developing solution, as for those characteristic values that cannot be automatically detected by the group of information sensors, such characteristic values are analyzed by using an analyzer, and the analyzed data is inputted through the data input device HO2.

Figure 13:
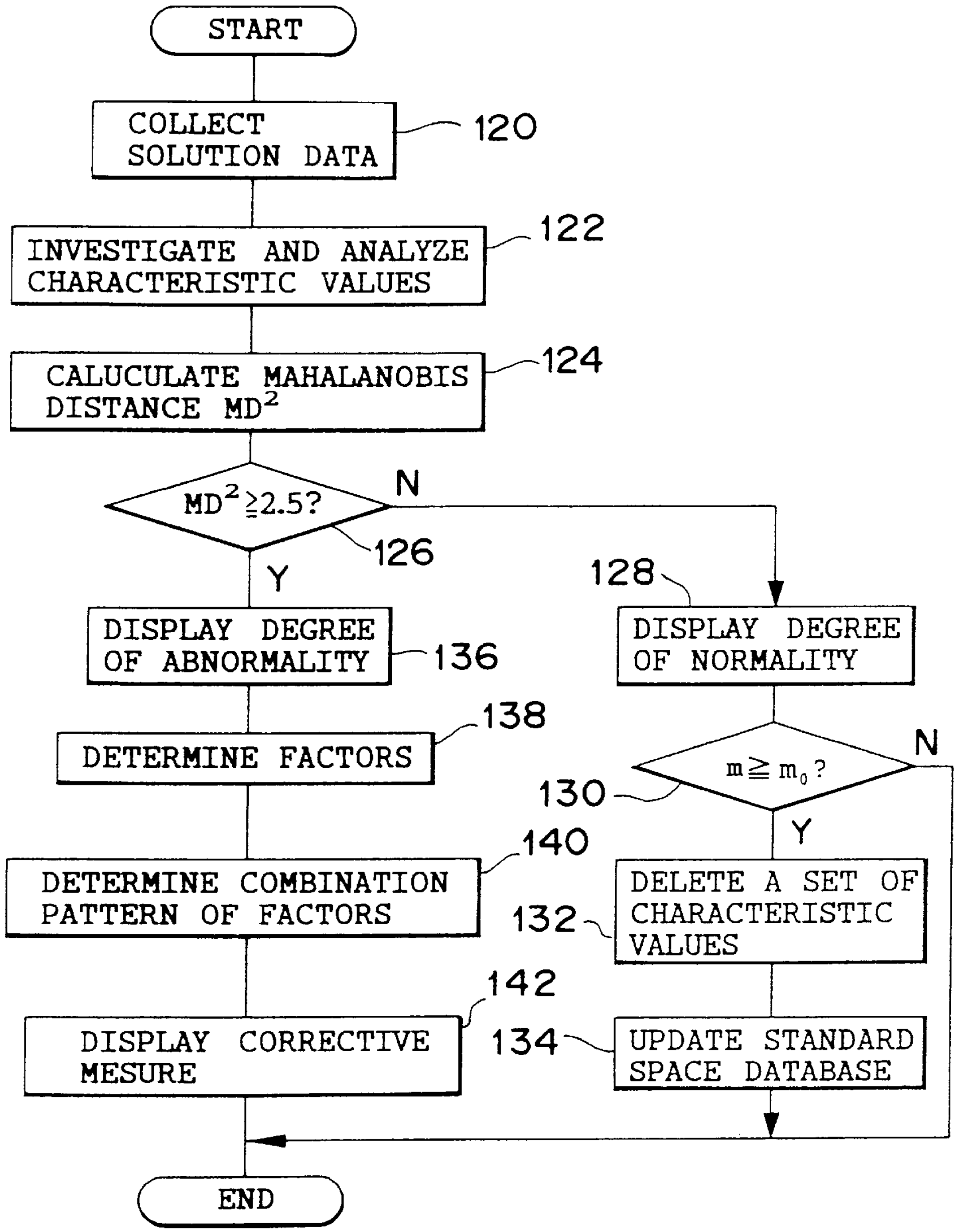
FIG. 13 is a flowchart illustrating a diagnosis and correction processing routine for each processing solution shown in FIG. 12.

Referring to FIG. 13, a description will be given of the details of Step 106 in FIG. 12. It should be noted that, in FIG. 13, portions corresponding to those of FIG. 5 are denoted by the same reference characters to give a description. In Step 120, the type of processor, as well as the amount of color negative film processed per day, operating hours per day, pH, and specific gravity which were detected by the group of information sensors 26N5 are fetched. At the same time, the amount of primary developing agent in the unit developing solution, the amount of sulfate in the unit developing solution, the amount of HAS in the unit developing solution, the amount of AF3 in the unit developing solution, the amount of Fe in the developing solution, and the like which were inputted through the data input device HO2 are fetched.

In the ensuing Step 122, investigation and analysis of the characteristic values made up of the processing conditions and compositions of the solutions are effected to determine the aforementioned 11 kinds of characteristic values. Specific examples of the data on the characteristic values and data subject to analysis are shown is Table 5.

TABLE 5

<Developing Solution for Color Negative>

| No. | 1 | 2 | 3 | | 10 | 11 | 12 | 13 | 14 | 15 | 16 | 17 | |
|---|---|---|---|---|---|---|---|---|---|---|---|---|---|
| Characteristic value Sample | Processing amount | Processor type | Operating hours | . . . | pH | Specific gravity | Primary develoing solution | $Na_2SO_3$ | HAS | AF3 | KBr | Fe | . . . |
| Unit | units/day | | hr/d | | | g/l | g/l | g/l | g/l | g/l | g/l | ppm | |
| Data 1 | 36 | A | 12 | | 10.08 | 1.037 | 4.40 | 3.50 | 2.60 | 1.85 | 1.20 | 0.1 | |
| Data 2 | 40 | A | 11 | | 10.10 | 1.041 | 4.45 | 3.76 | 2.58 | 1.92 | 1.10 | 0.1 | |
| Data 3 | 40 | B | 10 | | 10.08 | 1.038 | 4.26 | 3.73 | 2.68 | 2.06 | 1.12 | 0.1 | |
| Data 4 | 60 | B | 8 | | 10.07 | 1.040 | 4.31 | 3.82 | 2.70 | 1.96 | 1.14 | 0.2 | |
| Data 5 | 70 | B | 9 | | 10.09 | 1.039 | 4.19 | 3.59 | 2.50 | 1.88 | 1.16 | 0.2 | |
| Data 6 | 90 | O | 8 | | 10.09 | 1.039 | 4.25 | 3.63 | 2.49 | 2.00 | 1.15 | 0.1 | |
| | | . | | | | | | | | | | | |
| | | . | | | | | | | | | | | |
| | | . | | | | | | | | | | | |
| Data n | 25 | A | 10 | | 10.11 | 1.041 | 4.23 | 3.57 | 2.77 | 2.01 | 1.13 | 0.1 | |

TABLE 5-continued

<Developing Solution for Color Negative>

| No. | 1 | 2 | 3 | 10 | 11 | 12 | 13 | 14 | 15 | 16 | 17 |
|---|---|---|---|---|---|---|---|---|---|---|---|
| Analysis 1 | 50 | B | 9 | 10.03 | 1.037 | 3.89 | 3.13 | 2.16 | 1.61 | 1.48 | 0.1 |
| Analysis 2 | 35 | A | 10 | 10.08 | 1.033 | 3.87 | 3.33 | 2.28 | 1.77 | 1.02 | 0.1 |
| Analysis 3 | 30 | A | 12 | 10.00 | 1.043 | 3.80 | 2.70 | 2.01 | 1.50 | 1.21 | 0.1 |

In Step 122, the Mahalanobis distance is calculated in accordance with the above formulae, and in Step 126 a determination is made as to whether or not the Mahalanobis distance $MD^2$ is greater than or equal to the threshold value (e.g., 2.5). If the Mahalanobis distance is less than the threshold value, the solution is determined to be normal, and in Step 128 the Mahalanobis distance is displayed on the display unit HO3. In Step 130, a determination is made as to whether or not the number of sets m of normal values has become greater than or equal to a predetermined value $m_0$, (e.g., a value which is greater by 1 than the number of sets when the Mahalanobis space database was prepared). If $m \geqq m_0$, in Step 132, data of characteristic values in the oldest set in a time series is deleted to update the database. In Step 134, the database for the Mahalanobis space for the developing solution is updated by adding the set of data of the characteristic values newly detected to the data on the characteristic values in the normal state which was used in the preparation of the database for the Mahalanobis space for the developing solution on the previous occasion, and the database is set in the Mahalanobis space database HO1. On the other hand, if $m<m_0$, the routine ends without deleting the characteristic value data or updating the database for the Mahalanobis space for the developing solution.

On the other hand, if the Mahalanobis distance is greater than or equal to the predetermined value, a determination is made that the developing solution has become abnormal, and the calculated Mahalanobis distance is displayed on the display unit HO3 in Step 136 to display the degree of abnormality. Then, in Step 138, the factors which led to the abnormality are determined.

In the determination of the factors, the Mahalanobis distances are calculated with respect to the respective characteristic values, and the characteristic values with large Mahalanobis distances are determined to be the factors which caused the abnormality.

Figure 14:
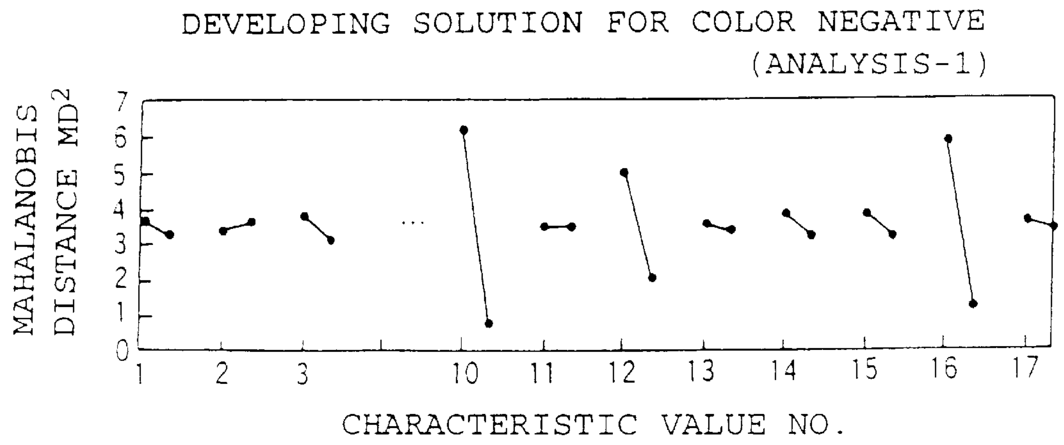
FIG. 14 is a diagram illustrating a factorial effect diagram for a developing solution for a color negative film.

FIG. 14 shows an example of a factorial effect diagram when a calculation is made by setting the average value as 0. FIG. 14 shows the case in which the pH, the primary developing agent, and the amount of KBr became abnormal. As explained in the first embodiment, those characteristic values for which the Mahalanobis distances in the case where characteristic values are present are greater than the Mahalanobis distances in the case where these characteristic values are not present and which have long straight lines can be determined to be the factors on the basis of this factorial effect diagram.

In the ensuing Step 140, a combination pattern of the factors of characteristic values determined to be the factors of abnormality is determined. In Step 142, processing corresponding to the combination pattern is displayed. Examples of combination patterns of factors and corrective measures therefor are shown below.

(1) Case Where pH, Primary Developing Agent, and KBr Are Abnormal

The replenishing conditions are checked, and if the amount of replenishment is insufficient, the amount of replenishment is reset so that the amount of replenishment increases.

(2) Case Where Specific Gravity and KBr Are Abnormal

A determination is made that the solution is tending to be concentrated, the conditions for setting the dilution ratio are checked, and the dilution ratio is reset so that the dilution ratio increases. The dilution ratio can be increased by increasing the amount of water supplied from the water replenishment tank.

(3) Case Where pH, Primary Developing Agent, HAS, and KBr Are Abnormal

An instruction is given to increase the amount of processing.

The case of the fixing solution is also similar to that of the developing solution, and if the Mahalanobis distance is greater than or equal to a predetermined value (e.g., 2.0), the fixing solution is determined to have become normal, and the calculated Mahalanobis distance is displayed on the display unit HO3 to display the degree of abnormality, and factors which led to the abnormality are determined.

Figure 15:
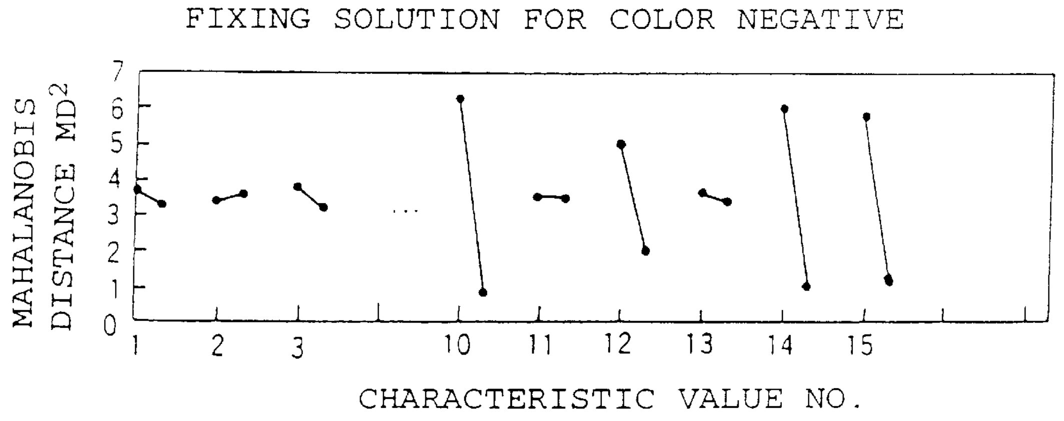
FIG. 15 is a diagram illustrating a factorial effect diagram for a fixing solution for the color negative film.

Specific examples of the data on the characteristic values of the fixing solution and data subject to analysis are shown in Table 6, and examples of the combination patterns of factors of abnormality in the case of the fixing solution as well as corrective measures therefor are shown below. In addition, FIG. 15 shows a factorial effect diagram in a case where pH, the amount of SS ($Na_2SO_3$), the amount of Ag, and the amount of 1.3PDTA-Fe became abnormal. Incidentally, the Mahalanobis distance in the normal state was 1.1 in Table 6.

TABLE 6

<Fixing Solution for Color Negative>

| No. | 1 | 2 | 3 | | 10 | 11 | 12 | 13 | 14 | 15 | |
|---|---|---|---|---|---|---|---|---|---|---|---|
| Characteristic value Sample | Processing amount | Processor type | Operating hours | . . . | pH | Specific gravity | $Na_2SO_3$ | ATS (75%) | Amount of Ag | 1.3 PDTA-Fe | . . . |
| Unit | units/day | | hr/d | | | g/l | g/l | g/l | g/l | g/l | |
| Data 1 | 40 | A | 11 | | 6.7 | 1.113 | 11.0 | 210 | 7.10 | 6.75 | |
| Data 2 | 40 | B | 10 | | 6.67 | 1.107 | 15.5 | 206 | 6.71 | 7.25 | |
| Data 3 | 60 | B | 8 | | 6.58 | 1.118 | 16.6 | 193 | 6.85 | 7.00 | |
| Data 4 | 70 | B | 9 | | 6.57 | 1.116 | 10.5 | 205 | 6.50 | 6.59 | |
| Data 5 | 90 | C | 8 | | 6.71 | 1.099 | 12.5 | 195 | 6.59 | 7.31 | |

TABLE 6-continued

<Fixing Solution for Color Negative>

| No. | 1 | 2 | 3 | 10 | 11 | 12 | 13 | 14 | 15 |
|---|---|---|---|---|---|---|---|---|---|
| Data 6 | 100 | C | 11 | 6.75 | 1.110 | 11.8 | 196 | 7.02 | 7.11 |
| Data 7 | 80 | C | 12 | 6.59 | 1.105 | 14.3 | 195 | 7.20 | 7.49 |
| | | . | | | | | | | |
| | | . | | | | | | | |
| | | . | | | | | | | |
| Data n | 26 | A | 10 | 6.65 | 1.110 | 15.1 | 203 | 6.98 | 7.20 |
| Sample subject to analysis | 40 | A | 11 | 6.30 | 1.113 | 9.3 | 180 | 7.62 | 8.75 |

Examples of Combination Patterns of Abnormality factors and Corrective Actions (1) Case Where pH, the Amount of SS, the Amount of Ag, and the Amount of 1.3PDTA-Fe Were Abnormal Replenishing conditions are checked, and if the amount of replenishment is insufficient, the amount of replenishment is increased so that the amount of replenishment increases.

Incidentally, minimum and necessary characteristic values for the diagnosis and correction of the state of the fixing solution are the pH of the fixing solution, the amount of $Na_2SO_3$ in the fixing solution, and the amount of Ag in the fixing solution.

The case of the bleaching solution is also similar to that of the developing solution, and if the Mahalanobis distance is greater than or equal to a predetermined value (e.g., 2.0), the bleaching solution is determined to have become normal, and the calculated Mahalanobis distance is displayed on the display unit HO3 to display the degree of abnormality, and factors which led to the abnormality are determined.

Figure 16:
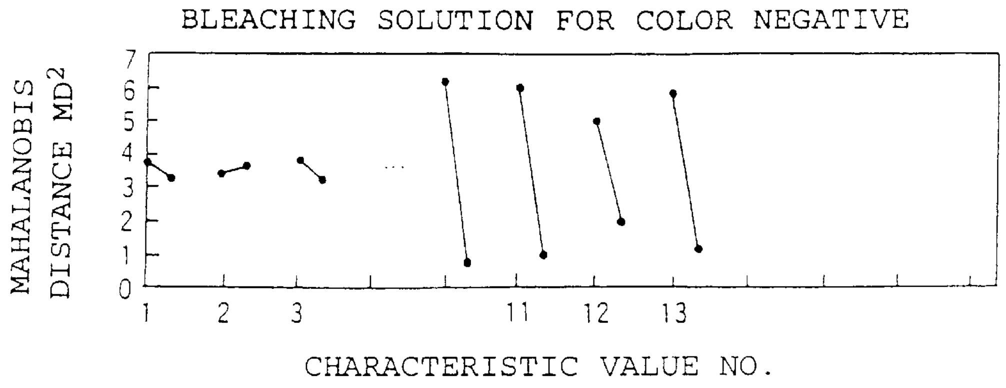
FIG. 16 is a diagram illustrating a factorial effect diagram for a bleaching solution for the color negative film.

Specific examples of the data on the characteristic values of the bleaching solution and data subject to analysis are shown in Table 7, and examples of the combination patterns of factors of abnormality in the case of the bleaching solution as well as corrective measures therefor are shown below. In addition. FIG. 16 shows a factorial effect diagram in a case where pH, specific gravity, the amount of 1.3PDTA-Fe, and the amount of $NH_4Br$ became abnormal. Incidentally, the Mahalanobis distance in the normal state was 1.2 in Table 7.

(1) Case Where pH, Specific Gravity, the Amount of 1.3PDTA-Fe, and the Amount of $NH_4Br$ Were Abnormal Squeegeeing of the developing solution is strengthened. Incidentally, minimum and necessary characteristic values for the diagnosis and correction of the state of the bleaching solution are the pH of the bleaching solution, the amount of KBr in the bleaching solution, and the amount of 1.3PDTA-Fe in the bleaching solution.

Next, a description will be given of a third embodiment of the present invention. In this embodiment, the present invention is applied to the determination and correction of the state of the bleach-fixing solution for the printer-processor.

Figure 18:
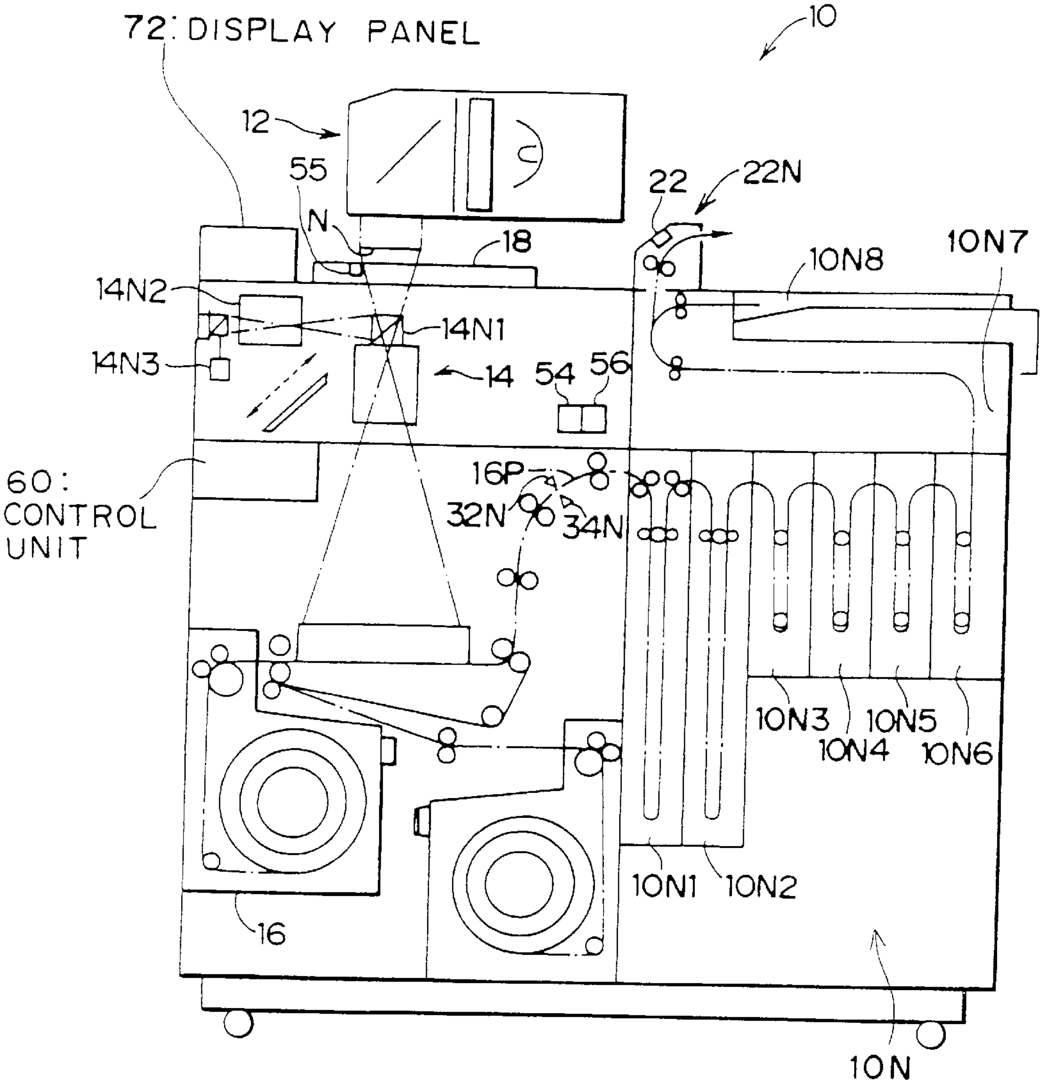
FIG. 18 is a schematic diagram of a printer-processor in accordance with a third embodiment of the present invention.

As shown in FIG. 18, a printer-processor 10 is provided with a light source section 12 having a light-adjusting filter constituted by C, M, and Y filters, a reflecting mirror, and a halogen lamp; a paper magazine section 16 in which color paper 16p serving as a photosensitive material is accommodated; and a paper magazine section 17 in which color paper 16p having a size different from the color paper 16p is accommodated.

The light emitted from the light source section 12 is radiated to an exposure section 14 through the negative film N loaded in a negative carrier 18. In addition, in the exposure section 14, an image on the negative film N is printed onto the color paper 16p (which may be the color paper 16p; hereafter, only the case of the color paper 16p will be described by way of example) drawn out from the paper magazine section 16, and is transported into a processor section 10.

TABLE 7

<Bleaching Solution for Coplor Negative>

| No. | 1 | 2 | 3 | | 10 | 11 | 12 | 13 | |
|---|---|---|---|---|---|---|---|---|---|
| Characteristic value Sample | Processing amount | Processor type | Operating hours | . . . | pH | Specific gravity | 1.3 PDTA-Fe | KBr | . . . |
| Unit | units/day | | hr/d | | | | g/l | g/l | |
| Data 1 | 35 | A | 12 | | 4.58 | 1.120 | 106.0 | 65.0 | |
| Data 2 | 40 | A | 11 | | 4.59 | 1.123 | 108.9 | 60.2 | |
| Data 3 | 40 | B | 10 | | 4.63 | 1.130 | 111.2 | 62.1 | |
| Data 4 | 60 | B | 8 | | 4.61 | 1.113 | 100.3 | 66.3 | |
| Data 5 | 70 | B | 9 | | 4.58 | 1.126 | 110.5 | 65.2 | |
| Data 6 | 90 | C | 8 | | 4.57 | 1.118 | 100.9 | 56.0 | |
| . | | | | | | | | | |
| . | | | | | | | | | |
| . | | | | | | | | | |
| Data n | 25 | A | 10 | | 4.61 | 1.115 | 103.0 | 57.5 | |
| Sample subject to analysis | 50 | B | 9 | | 4.85 | 1.107 | 95.0 | 50.2 | |

This processor section 10N is comprised of processing tanks including a color development processing tank 10N1, a bleach-fix processing tank 10N2, and rinse processing tanks 10N3 to 10N6, as well as a drying section 10N7. It should be noted that a color development processing solution is stored in the color development processing tank 10N1, a bleach-fixing solution is stored in the bleach-fix processing tank 10N2, and rinsing solutions are stored in the rinse processing tanks 10N3 to 10N6. The color paper 16p developed by the color development processing tank 10N1 is subjected to fixation processing in the bleach-fix processing tank 10N2, is then washed in the rinse processing tanks 10N3 to 10N6, and is subjected to dry processing in the drying section 10N7, thereby preparing a color print. This color print is placed on a sorter section 10N8.

In this printer-processor, a display panel 72, a code reading sensor 55 for reading a bar code and a DX code recorded on the negative film N in the negative carrier 18, and a scanner 14N3 for detecting the amount of exposure (corresponding to the density of the negative film) by detecting through a lens 14N2 the light transmitted through the image on the negative film N on the reflecting side of a reflecting mirror 14N1 of the exposure section 14 are respectively disposed on an upper portion of the printer-processor. In addition, in this printer-processor, a width detecting sensor which is comprised of the infrared radiating unit 32N and the detecting unit 34N, as well as a densitometer 22 for measuring the density of the image exposed on the color paper 16p transported into an density measuring section 22N, are disposed in the vicinity of the upstream side, as viewed in the transporting direction of the color paper 16p, of the color development processing tank 10N1. Further, the environment thermometer 54 for detecting the environmental temperature and the environment hygrometer 56 for detecting the environmental humidity are disposed at locations which are not affected by the heat from the drying section 10N7 and the exposure section 14.

It should be noted that in a case where the printer-processor is connected via a communication line to a film processor having an environment thermometer, an environment hygrometer, and a code reading sensor, information on the environmental temperature, the environmental humidity, the bar code, and the DX code detected by the film processor may be fetched. In this case, the environment thermometer 54, the environment hygrometer 56, and the code reading sensor 55 of the printer-processor may be omitted.

It should be noted that the processing tanks 10N1 to 10N6 and a control unit 60 are similar to those of the above-described film processor, a description thereof will be omitted.

In addition, in the above-described printer-processor, the diagnosis and correction of the bleach-fixing solution were effected, and as the characteristic values of the bleach-fixing solution, the following characteristic values were used: the amount of processing for each type of photosensitive material, the type of processor, operating hours per day (hours/day), pH, specific gravity, the amount (g/l) of Ag per unit amount of bleach-fixing solution, the amount (g/l) of EDTA-Fe per unit amount of bleach-fixing solution, the amount (g/l) of SS per unit amount of bleach-fixing solution, and the amount (ml/l) of ATS per unit amount of bleach-fixing solution. Minimum and necessary characteristic values which cause no problems in practical use in the diagnosis and correction of the bleach-fixing solution for color paper are the pH, the amount of SS, and the amount of EDTA-Fe.

Figure 17:
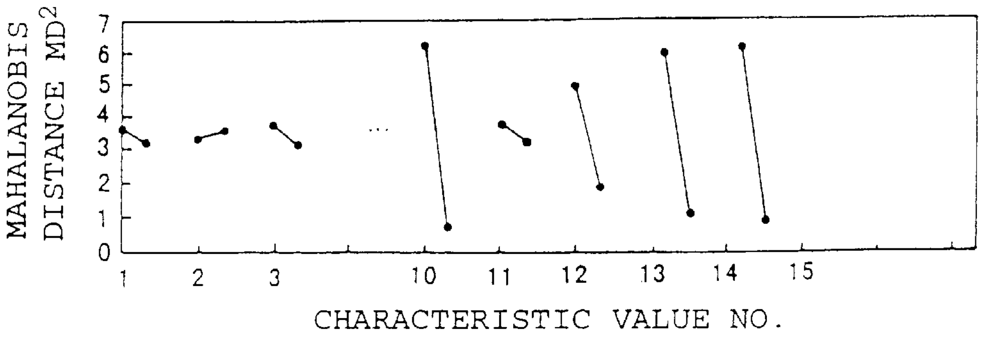
FIG. 17 is a diagram illustrating a factorial effect diagram for a bleach-fixing solution for color paper.

Specific examples of the data on the characteristic values of the bleach-fixing solution for color paper and data subject to analysis are shown in Table 8, and examples of the combination patterns of factors of abnormality in the case of the bleaching solution as well as corrective measures therefor are shown below. In addition, FIG. 17 shows a factorial effect diagram in a case where pH, the amount of Ag, the amount of EDTA-Fe, and the amount of SS became abnormal. Incidentally, the Mahalanobis distance MD in the normal state was 1.5 in Table 8.

TABLE 8

<Bleach-Fixing Solution for Color Paper>

| No. | 1 | 2 | 3 | | 10 | 11 | 12 | 13 | 14 | 14 |
|---|---|---|---|---|---|---|---|---|---|---|
| Characteristic value Sample | Processing amount | Processor type | Operating hours | . . . | pH | Specific gravity | Amount of Ag | EDTA-Fe | $Na_2SO_3$ | ATS (75%) |
| Unit | Lalze/day | | hr/d | | | | g/l | g/l | g/l | ml/l |
| Data 1 | 2300 | A | 10 | | 7.30 | 1.120 | 7.94 | 48.9 | 21.9 | 100.5 |
| Data 2 | 1850 | B | 11 | | 7.30 | 1.121 | 7.26 | 49.0 | 24.3 | 107.2 |
| Data 3 | 1000 | C | 12 | | 7.21 | 1.122 | 7.81 | 51.2 | 23.2 | 108.0 |
| Data 4 | 3000 | A | 9 | | 7.25 | 1.128 | 7.87 | 55.0 | 21.0 | 111.0 |
| Data 5 | 2000 | A | 8 | | 7.32 | 1.116 | 8.10 | 47.3 | 20.8 | 98.9 |
| Data 6 | 1700 | B | 10 | | 7.20 | 1.115 | 8.06 | 47.0 | 24.6 | 97.4 |
| Data 7 | 1400 | B | 7 | | 7.25 | 1.126 | 7.75 | 52.1 | 19.6 | 101.8 |
| | | . . . | | | | | | | | |
| Data n | 3500 | D | 12 | | 7.22 | 1.115 | 7.77 | 46.9 | 19.9 | 94.6 |
| Sample subject to analysis | 1600 | B | 10 | | 7.51 | 1.113 | 6.80 | 41.0 | 13.7 | 81.6 |

(1) Case Where pH, the Amount of Ag, the AMOUNT OF EDTA-Fe, a nd the amount of SS Were Abnormal Squeegeeing is strengthened.

A s the characteristic values of the developing solution for the aforementioned plate-making photosensitive material, it is possible to use the amount of processing per month ($m^2$/month), the type of processor, operating hours per day (hours/day), the pH of the developing solution, the specific gravity of the developing solution, the amount (g/l) of HQ (hydroquinone) in a unit developing solution, the amount (g/l) of sulfite ($Na_2SO_3$) in a unit developing solution, the amount (g/l) of compound A (5-methylbenzotriazole) in a unit developing solution, the amount (g/l) of compound B (sodium erythorbate) in a unit developing solution, and the amount (g/l) of halogen (KBr) in a unit developing solution. Minimum and necessary characteristic values for the diagnosis a nd correction of the developing solution for plate-making photosensitive material are the pH, specific gravity, the amount of HQ, the amount of SS ($Na_2SO_3$) the amount of KBr, and the amount of processing.

In addition, although in the foregoing embodiments a description has been given of examples in which the environmental temperature and the like are not used as the characteristic values, the environmental temperature, the environmental humidity, the electric conductivity of the processing solution, the temperature of the processing solution, and the like may be used as the characteristic values.

In addition, as the apparatus subject to determination of the state is connected on-line to the communication controller, network management can be effected.

What is claimed is:

1. A method of determining the processing state of a photosensitive material, comprising the steps of:

preparing a Mahalanobis space on the basis of characteristic values of a processing solution for a photosensitive material in a normal state or respective characteristic values of the processing solution and a processing condition for the photosensitive material in the normal state;

calculating a Mahalanobis distance on the basis of the Mahalanobis space; and determining the state of at least one of the processing solution and the processing condition on the basis of the Mahalanobis distance calculated.

2. A method of determining the processing state of a photosensitive material, comprising the steps of:

detecting n (where n≧ak if a is assumed to be a positive integer greater than or equal to 1) sets of k (where k is an integer≧2) kinds of characteristic values with respect to a processing solution for processing a photosensitive material, or the processing solution and a processing condition for processing the photosensitive material;

calculating a Mahalanobis distance ($MD^2$) which is expressed by a formula below with respect to a combination of the k kinds of characteristic values $Y_{i,j}$ (where, i is the number of characteristic values, and i=1, 2, 3, . . . , k; and j is the number of sets of characteristic values, and j=1, 2, 3, . . . , n) detected at the time of conducting the determination of the state;

and determining the state of at least one of the processing solution and the processing condition on the basis of a magnitude of the Mahalanobis distance calculated $$MD^2 = \frac{1}{k} \sum_{p,q=1}^{k} a_{pq} \cdot y_p \cdot y_q$$

where $a_{pq}$ is a component of an inverse matrix $R^{-1}$ of a correlation matrix R having as its components correlation coefficients $r_{p,q}$ (where, p, q=1, 2, 3, . . . , k) between a p-th standardized characteristic value $y_p$ and a q-th standardized characteristic value $y_q$ among k standardized characteristic values $y_i$ of a set of number j, and is a value indicating a Mahalanobis space prepared in advance on the basis of the k kinds of n sets of the characteristic values of the processing solution and the processing condition in a normal state, a standardized characteristic value $y_{i,j}$ of the set of number j being expressed by a following formula by using an average value $m_i$ of the characteristic value of number i and a standard deviation σi of the characteristic value of number i:

$$y_{i,j}=(Y_{i,j}-m_i)/\sigma_i$$

where $$m_i=(Y_{i,1}+Y_{i,2}+. . . +Y_{i,n})/n$$

$$\sigma_i^2=[(Y_{i,1}-m_i)^2+(Y_{i,2}-m_i)^2+. . . (Y_{i,n}-m_i)^2]/(n-1).$$

3. The method of determining the processing state of a photosensitive material according to claim 2, wherein the value of at least one of the k and the n is variable.

4. The method of determining the processing state of a photosensitive material according to claim 2, wherein one of the number of users subject to determination of the processing state and a sampling frequency when sampling is effected in a time series is set as n.

5. The method of determining the processing state of a photosensitive material according to claim 2, wherein the Mahalanobis distance is calculated by adding newly detected m (where m is an integer≧1) sets of characteristic values to the n sets of characteristic values detected in advance.

6. The method of determining the processing state of a photosensitive material according to claim 2, wherein if the number of the sets of characteristic values has reached (n+m) sets by adding newly detected sets of characteristic values, at least one set of characteristic values is deleted to calculate the Mahalanobis distance.

7. The method of determining the processing state of a photosensitive material according to claim 1, wherein the characteristic values in the normal state for preparing the Mahalanobis space include a characteristic value of the processing solution in its initial state.

8. The method of determining the processing state of a photosensitive material according to claim 2, wherein the characteristic values in the normal state for preparing the Mahalanobis space include a characteristic value of the processing solution in its initial state.

9. The method of determining the processing state of a photosensitive material according to claim 1, wherein if the processing solution for the photosensitive material is a developing solution for a plate-making photosensitive material, at least the pH of the developing solution, the specific gravity of the developing solution, the amount of primary developing agent in the developing solution, the amount of sulfate in the developing solution, and the amount of plate-making photosensitive material processed are used as the characteristic values.

10. The method of determining the processing state of a photosensitive material according to claim 2, wherein if the processing solution for the photosensitive material is a developing solution for a plate-making photosensitive material, at least the pH of the developing solution, the specific gravity of the developing solution, the amount of primary developing agent in the developing solution, the amount of sulfate in the developing solution, and the amount of plate-making photosensitive material processed are used as the characteristic values.

11. The method of determining the processing state of a photosensitive material according to claim 1, wherein if the processing solution for the photosensitive material is a fixing solution for a plate-making photosensitive material, at least the pH of the fixing solution, the amount of thiosulfate in the fixing solution, and the amount of sulfate in the fixing solution are used as the characteristic values.

12. The method of determining the processing state of a photosensitive material according to claim 2, wherein if the processing solution for the photosensitive material is a fixing solution for a plate-making photosensitive material, at least the pH of the fixing solution, the amount of thiosulfate in the fixing solution, and the amount of sulfate in the fixing solution are used as the characteristic values.

13. The method of determining the processing state of a photosensitive material according to claim 1, wherein if the processing solution for the photosensitive material is a developing solution for a color photosensitive material, at least the pH of the developing solution, the specific gravity of the developing solution, the amount of primary developing agent in the developing solution, the amount of sulfate in the developing solution, and the amount of halogen in the developing solution are used as the characteristic values.

14. The method of determining the processing state of a photosensitive material according to claim 2, wherein if the processing solution for the photosensitive material is a developing solution for a color photosensitive material, at least the pH of the developing solution, the specific gravity of the developing solution, the amount of primary developing agent in the developing solution, the amount of sulfate in the developing solution, and the amount of halogen in the developing solution are used as the characteristic values.

15. The method of determining the processing state of a photosensitive material according to claim 1, wherein if the processing solution for the photosensitive material is a fixing solution for a color photosensitive material, at least the pH of the fixing solution, the amount of sulfate in the fixing solution, and the amount of silver in the fixing solution are used as the characteristic values.

16. The method of determining the processing state of a photosensitive material according to claim 2, wherein if the processing solution for the photosensitive material is a fixing solution for a color photosensitive material, at least the pH of the fixing solution, the amount of sulfate in the fixing solution, and the amount of silver in the fixing solution are used as the characteristic values.

17. The method of determining the processing state of a photosensitive material according to claim 1, wherein if the processing solution for the photosensitive material is a bleaching solution for a color film, at least the pH of the bleaching solution, the amount of halogen in the bleaching solution, and the amount of amino polycarboxylic acid-iron complex in the bleaching solution are used as the characteristic values.

18. The method of determining the processing state of a photosensitive material according to claim 2, wherein if the processing solution for the photosensitive material is a bleaching solution for a color film, at least the pH of the bleaching solution, the amount of halogen in the bleaching solution, and the amount of amino polycarboxylic acid-iron complex in the bleaching solution are used as the characteristic values.

19. The method of determining the processing state of a photosensitive material according to claim 1, wherein if the processing solution for the photosensitive material is a bleach-fixing solution for a color paper, at least the pH of the bleach-fixing solution, the amount of sulfate in the bleach-fixing solution, and the amount of amino polycarboxylic acid-iron complex in the bleach-fixing solution are used as the characteristic values.

20. The method of determining the processing state of a photosensitive material according to claim 2, wherein if the processing solution for the photosensitive material is a bleach-fixing solution for a color paper, at least the pH of the bleach-fixing solution, the amount of sulfate in the bleach-fixing solution, and the amount of amino polycarboxylic acid-iron complex in the bleach-fixing solution are used as the characteristic values.

21. The method of determining the processing state of a photosensitive material according to claim 1, wherein the state of at least one of the processing solution and the processing condition is determined on the basis of a result of comparisons, carried out for each of characteristic values, between the Mahalanobis distance in a case in which a characteristic value is present and the Mahalanobis distance in a case in which said characteristic value is not present.

22. The method of determining the processing state of a photosensitive material according to claim 2, wherein the state of at least one of the processing solution and the processing condition is determined on the basis of a result of comparisons, carried out for each of characteristic values, between the Mahalanobis distance in a case in which a characteristic value is present and the Mahalanobis distance in a case in which said characteristic value is not present.

23. A method of correcting the processing state of a photosensitive material for correcting at least one of the processing solution and the processing condition on the basis of a result of determination made by the method of determining the processing state of a photosensitive material according to any one of claims 1 to 22.

* * * * *